United States Patent
Chun et al.

(10) Patent No.: US 11,394,420 B2
(45) Date of Patent: Jul. 19, 2022

(54) ELECTRONIC DEVICE INCLUDING HOUSING HAVING PATTERN FORMED THEREON

(71) Applicant: Samsung Electronics Co., Ltd., Gyeonggi-do (KR)

(72) Inventors: Jihwan Chun, Gyeonggi-do (KR); Sungho Cho, Gyeonggi-do (KR); Changyoun Hwang, Gyeonggi-do (KR); Jihyun Kim, Gyeonggi-do (KR); Byungsoo Moon, Gyeonggi-do (KR); Sungwhan Yoon, Gyeonggi-do (KR); Yunjin Nam, Gyeonggi-do (KR); Minwoo Yoo, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/283,062

(22) PCT Filed: Nov. 6, 2019

(86) PCT No.: PCT/KR2019/015001
§ 371 (c)(1),
(2) Date: Apr. 6, 2021

(87) PCT Pub. No.: WO2020/096355
PCT Pub. Date: May 14, 2020

(65) Prior Publication Data
US 2022/0006479 A1    Jan. 6, 2022

(30) Foreign Application Priority Data
Nov. 6, 2018 (KR) .................. 10-2018-0135453
Sep. 24, 2019 (KR) .................. 10-2019-0117744

(51) Int. Cl.
*H04B 7/00* (2006.01)
*H04B 1/3888* (2015.01)
*H04M 1/02* (2006.01)

(52) U.S. Cl.
CPC ........ *H04B 1/3888* (2013.01); *H04M 1/0266* (2013.01); *H04M 1/0262* (2013.01); *H04M 1/0264* (2013.01)

(58) Field of Classification Search
CPC .............. H04B 1/3888; H04M 1/0266; H04M 1/0262; H04M 1/0264
(Continued)

(56) References Cited

U.S. PATENT DOCUMENTS 8,204,561 B2 *   6/2012  Mongan ............... H04B 1/3888
                                                 455/575.8
8,406,827 B2 *   3/2013  Liu ..................... H04M 1/0283
                                                 455/575.8
(Continued)

FOREIGN PATENT DOCUMENTS

CN    104582352 A    4/2015
CN    205179574 U    4/2016
(Continued)

OTHER PUBLICATIONS

European Search Report dated Oct. 29, 2021.
European Search Report dated Feb. 7, 2022.

*Primary Examiner* — April G Gonzales
(74) *Attorney, Agent, or Firm* — Cha & Reiter, LLC

(57) ABSTRACT

An electronic device is disclosed. The electronic device comprises: a housing; and a pattern region formed on at least a portion of the surface of the housing. The pattern region includes a first edge, a second edge, and a first pattern formed between the first edge and the second edge. The first pattern includes a first floor portion, a first valley portion and a second valley portion which are positioned closer than the
(Continued)

first floor portion to the inner space of the housing, and a first inclined surface extending from the first floor portion to the first valley portion and the second valley portion. The first floor portion may be formed in a first color, and the first inclined surface may be formed in a second color.

15 Claims, 23 Drawing Sheets

(58) Field of Classification Search
USPC .............................................. 455/575.1, 90.3
See application file for complete search history.

(56) References Cited

U.S. PATENT DOCUMENTS

| | | | | | |
|---|---|---|---|---|---|
| 8,620,215 | B2* | 12/2013 | Abel | .................. | G06Q 30/0207 |
| | | | | | 235/382 |
| 8,896,991 | B2* | 11/2014 | Ternus | .................. | G06F 1/1643 |
| | | | | | 361/679.55 |
| 9,699,926 | B2* | 7/2017 | Hwang | ............... | B29C 45/0053 |
| 9,988,725 | B2* | 6/2018 | Choi | ...................... | C25D 11/12 |
| 10,051,096 | B2* | 8/2018 | Baek | .................. | H04M 1/0262 |
| 2008/0317980 | A1* | 12/2008 | Yuba | ......................... | B44C 1/10 |
| | | | | | 156/196 |
| 2011/0164365 | A1* | 7/2011 | McClure | ............... | G06F 1/1658 |
| | | | | | 361/679.55 |
| 2011/0166690 | A1* | 7/2011 | Ternus | ................ | H05K 1/0281 |
| | | | | | 312/223.2 |
| 2012/0064303 | A1* | 3/2012 | Yashiki | ................ | G02B 5/1842 |
| | | | | | 427/162 |
| 2013/0209676 | A1* | 8/2013 | Yashiki | .................. | B42D 25/29 |
| | | | | | 427/162 |
| 2014/0045557 | A1* | 2/2014 | Chung | ................ | H04M 1/0249 |
| | | | | | 455/575.1 |
| 2014/0228080 | A1* | 8/2014 | Choi | .................... | B29C 45/0055 |
| | | | | | 455/575.1 |
| 2015/0111623 | A1* | 4/2015 | Hegemier | ............... | B44C 1/105 |
| | | | | | 455/575.1 |
| 2016/0050302 | A1* | 2/2016 | Lee | ........................ | G06F 1/1656 |
| | | | | | 455/575.1 |
| 2016/0105206 | A1* | 4/2016 | Zhang | ................. | H04B 1/3888 |
| | | | | | 72/46 |
| 2016/0233037 | A1 | 8/2016 | Lee et al. | | |
| 2016/0299528 | A1 | 10/2016 | Mori et al. | | |
| 2017/0013735 | A1* | 1/2017 | Choi | ..................... | G06F 1/1658 |
| 2017/0149940 | A1* | 5/2017 | Moon | .................. | H04M 1/0268 |
| 2017/0347476 | A1* | 11/2017 | Hwang | ................. | C25D 11/246 |
| 2020/0201386 | A1 | 6/2020 | Hwang et al. | | |

FOREIGN PATENT DOCUMENTS

| | | |
|---|---|---|
| DE | 68919411 T2 | 3/1995 |
| EP | 3396931 A1 | 10/2018 |
| KR | 10-2012-0063939 A | 6/2012 |
| KR | 10-2014-0112326 A | 9/2014 |
| KR | 10-1601513 B1 | 3/2016 |
| KR | 10-2016-0097106 A | 8/2016 |
| KR | 10-2017-0006709 A | 1/2017 |

* cited by examiner

ELECTRONIC DEVICE INCLUDING HOUSING HAVING PATTERN FORMED THEREON

CROSS REFERENCE TO RELATED APPLICATIONS

This application is a National Phase Entry of PCT International Application No. PCT/KR2019/015001, which was filed on Nov. 6, 2019, and claims a priority to Korean Patent Application No. 10-2018-0135453, which was filed on Nov. 6, 2018, and Korean Patent Application No. 10-2019-0117744, which was filed on Sep. 24, 2019, the contents of which are incorporated herein by reference.

TECHNICAL FIELD

Embodiments of the disclosure described herein relate to a housing having a pattern formed thereon, an electronic device including the housing, and a method for manufacturing the housing.

BACKGROUND ART

The housing of an electronic device may have a pattern or design formed on a surface thereof to provide an aesthetic sense to a user. The pattern or design may express texture. The housing may be formed of a metallic material. In general, the housing formed of a metallic material may be manufactured by using an injection mold. The housing may be manufactured after the pattern is formed on the mold through mechanical machining such as CNC.

DISCLOSURE

Technical Problem

The housing may include a metal portion and an insulating portion that insulates part of the metal portion. In this case, the pattern is formed on only the metal portion and is cut off by the insulating portion. An additional pattern may be formed on the insulating portion. However, the additional pattern may not be continuously connected with the pattern formed on the metal portion.

The mold is repeatedly used in an injection-molding process, and the pattern formed on the mold may be damaged as the injection-molding process is repeated. Due to this, a non-uniform pattern may be formed on the surface of the housing. Furthermore, the shape of the pattern may be limited to prevent damage to the pattern.

Embodiments of the disclosure provide a housing having various forms of patterns formed thereon and an electronic device including the housing.

In addition, embodiments of the disclosure provide a housing including a pattern continuously formed on a metal portion and an insulating portion and an electronic device including the housing.

Technical Solution

An electronic device according to an embodiment of the disclosure includes a housing and a patterned region formed on at least part of a surface of the housing. The patterned region includes a first edge, a second edge, and a first pattern formed between the first edge and the second edge. The first pattern includes a first ridge, a first valley and a second valley located closer to an interior space of the housing than the first ridge, and first inclined surfaces extending from the first ridge to the first valley and the second valley. The first ridge is formed in a first color, and the first inclined surfaces are formed in a second color.

An electronic device according to an embodiment of the disclosure includes a housing including a first surface, a second surface that faces away from the first surface, and a third surface that surrounds a space between the first surface and the second surface, and a display disposed in the space of the housing so as to be visible through the first surface. The third surface includes a first region including a pattern formed on a surface thereof, a second region formed between the first region and the first surface, and a third region formed between the first region and the second surface. The first region includes a curved surface having the center of curvature located in a direction toward the space of the housing with respect to the third surface.

An electronic device according to an embodiment of the disclosure includes a first plate that forms a first surface of the electronic device, a second plate that faces away from the first plate and that forms a second surface of the electronic device, and a side member that surrounds a space between the first plate and the second plate and that includes an outer surface forming a third surface of the electronic device. The outer surface includes a first edge adjacent to the first plate, a second edge adjacent to the second plate, and a pattern formed between the first edge and the second edge. The side member includes a first metal portion and a second metal portion that are formed of a metallic material and an insulating portion formed of an insulating material and formed between the first metal portion and the second metal portion. The insulating portion forms an insulating region extending from the first edge to the second edge. The pattern has a continuous shape extending from the first metal portion to the second metal portion through the insulating region.

Advantageous Effects

According to the embodiments of the disclosure, the housings of the electronic devices may include a pattern continuously formed on the metal portion and the insulating portion.

In addition, the disclosure may provide various effects that are directly or indirectly recognized.

DESCRIPTION OF DRAWINGS

With regard to description of the drawings, identical or similar reference numerals may be used to refer to identical or similar components.

MODE FOR INVENTION

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

Figure 1:
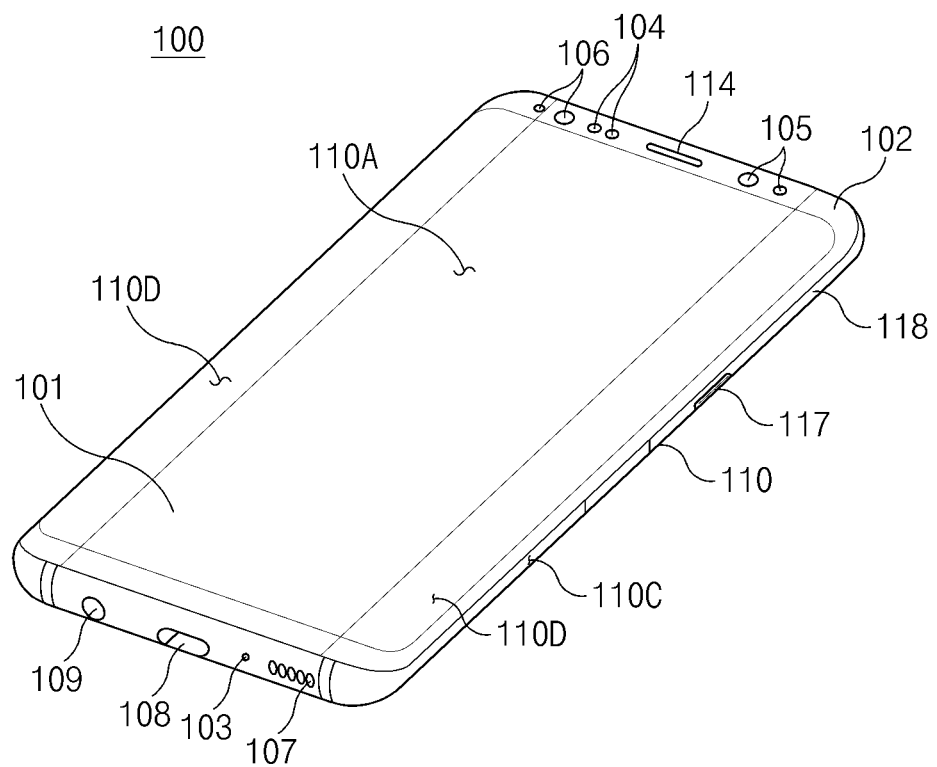
FIG. 1 is a perspective view illustrating a front side of an electronic device according to an embodiment.
Figure 2:
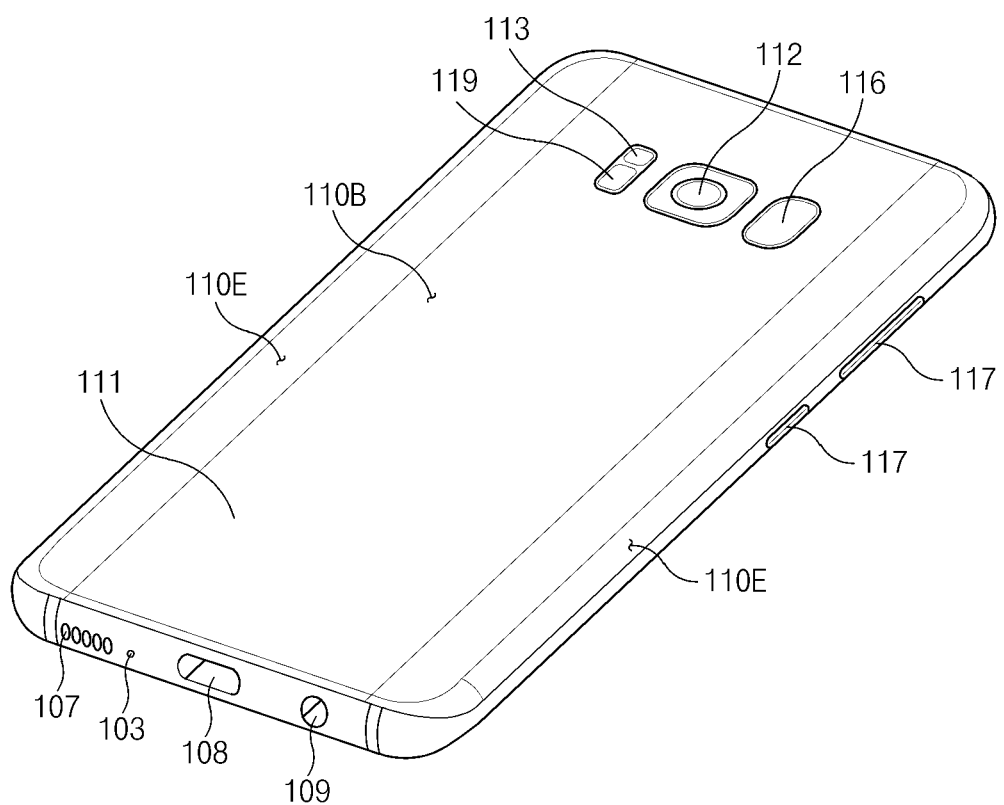
FIG. 2 is a perspective view illustrating a rear side of the electronic device according to the embodiment.
Figure 3:
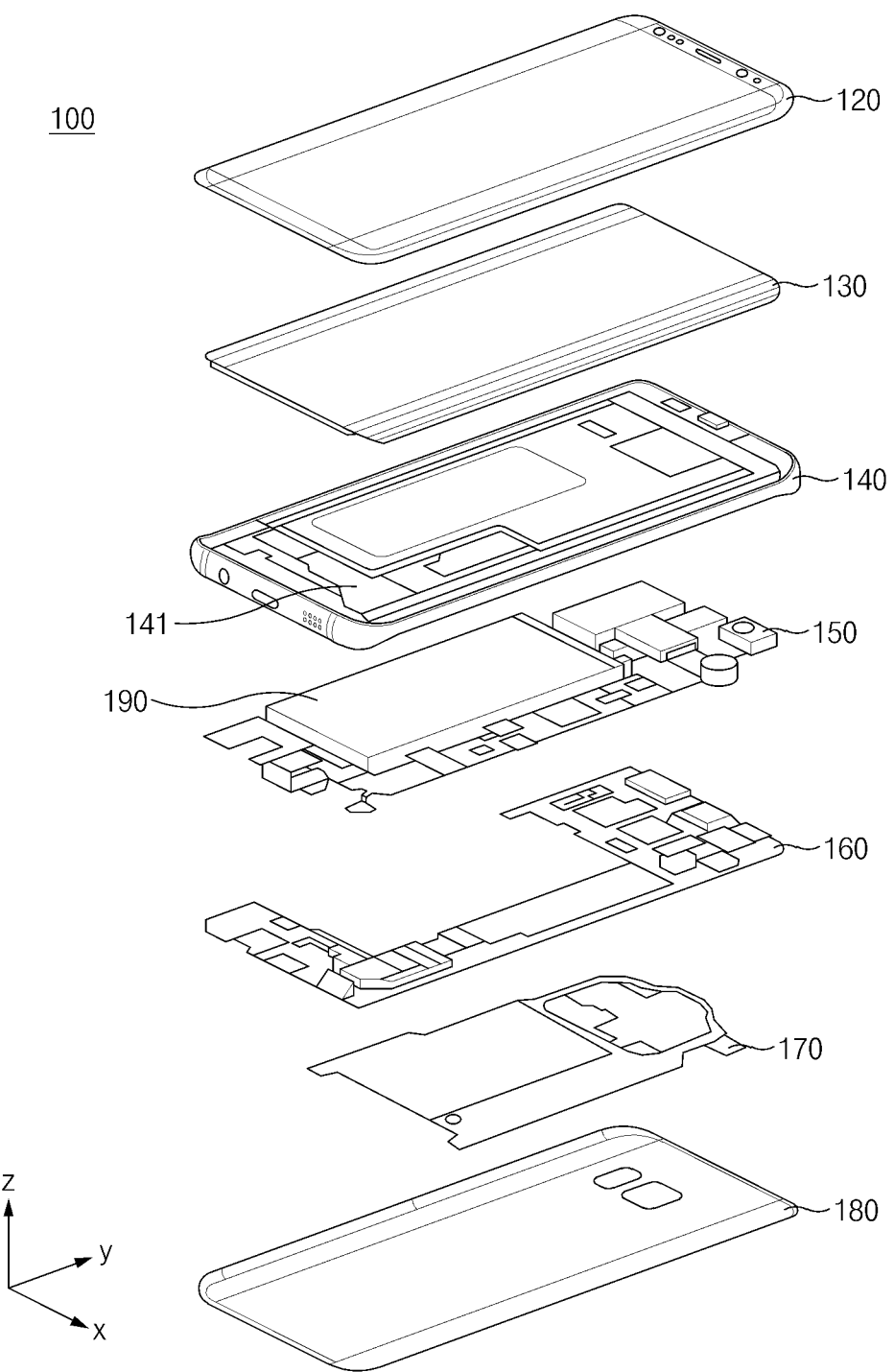
FIG. 3 is an exploded perspective view of the electronic device according to an embodiment.

FIG. 1 is a perspective view illustrating a front side of an electronic device according to an embodiment. FIG. 2 is a perspective view illustrating a rear side of the electronic device according to an embodiment. FIG. 3 is an exploded perspective view of the electronic device according to an embodiment.

Referring to FIGS. 1 and 2, an electronic device 100 according to an embodiment may include a housing 110 that includes a first surface (or, a front surface) 110A, a second surface (or, a rear surface) 110B, and side surfaces 110C surrounding a space between the first surface 110A and the second surface 110B. In another embodiment (not illustrated), a housing may refer to a structure that forms some of the first surface 110A, the second surface 110B, and the side surfaces 110C of FIG. 1. According to an embodiment, the first surface 110A may be formed by a front plate 102 (e.g., a glass plate including various coating layers, or a polymer plate), at least part of which is substantially transparent. The second surface 110B may be formed by a back plate 111 that is substantially opaque. The back plate 111 may be formed of, for example, coated or colored glass, ceramic, polymer, metal (e.g., aluminum, stainless steel (STS), or magnesium), or a combination of at least two of the aforementioned materials. The side surfaces 110C may be formed by a side bezel structure (or, a "side member") 118 that is coupled with the front plate 102 and the back plate 111 and that contains metal and/or polymer. In some embodiments, the back plate 111 and the side bezel structure 118 may be integrally formed with each other and may contain the same material (e.g., a metallic material such as aluminum).

In the illustrated embodiment, the front plate 102 may include, at opposite long edges thereof, two first regions 110D that curvedly and seamlessly extend from the first surface 110A toward the back plate 111. In the illustrated embodiment (refer to FIG. 2), the back plate 111 may include, at opposite long edges thereof, two second regions 110E that curvedly and seamlessly extend from the second surface 110B toward the front plate 102. In some embodiments, the front plate 102 (or, the back plate 111) may include only one of the first regions 110D (or, the second regions 110E). In another embodiment, a part of the first regions 110D or the second regions 110E may not be included. In the embodiments, when viewed from a side of the electronic device 100, the side bezel structure 118 may have a first thickness (or, width) at sides not including the first regions 110D or the second regions 110E and may have a second thickness at sides including the first regions 110D or the second regions 110E, the second thickness being smaller than the first thickness.

According to an embodiment, the electronic device 100 may include at least one of a display 101, audio modules 103, 107, and 114, sensor modules 104, 116, and 119, camera modules 105, 112, and 113, key input devices 117, a light emitting element 106, or connector holes 108 and 109. In some embodiments, the electronic device 100 may omit at least one component (e.g., the key input devices 117 or the light emitting element 106) among the aforementioned components, or may additionally include other component(s).

The display 101, for example, may be exposed through most of the front plate 102. In some embodiments, at least part of the display 101 may be exposed through the front plate 102 that forms the first surface 110A and the first regions 110D of the side surfaces 110C. In some embodiments, the periphery of the display 101 may be formed to be substantially the same as the shape of the adjacent outside edge of the front plate 102. In another embodiment (not illustrated), the gap between the outside edge of the display 101 and the outside edge of the front plate 102 may be substantially constant to expand the area by which the display 101 is exposed.

In another embodiment (not illustrated), a recess or opening may be formed in part of a screen display area of the display 101, and the electronic device 100 may include at least one of the audio module 114, the sensor module 104, the camera module 105, or the light emitting element 106 that is aligned with the recess or opening. In another embodiment (not illustrated), the electronic device 100 may include, on a rear surface of the screen display area of the display 101, at least one of the audio module 114, the sensor module 104, the camera module 105, the fingerprint sensor 116, or the light emitting element 106. In another embodiment (not illustrated), the display 101 may be combined with, or disposed adjacent to, touch detection circuitry, a pressure sensor for measuring the intensity (pressure) of a touch, and/or a digitizer for detecting a stylus pen of a magnetic field type. In some embodiments, at least a part of the sensor modules 104 and 119 and/or at least a part of the key input devices 117 may be disposed in the first regions 110D and/or the second regions 110E.

The audio modules 103, 107, and 114 may include the microphone hole 103 and the speaker holes 107 and 114. A microphone for obtaining an external sound may be disposed in the microphone hole 103, and in some embodiments, a plurality of microphones may be disposed in the microphone hole 103 to sense the direction of a sound. The speaker holes 107 and 114 may include the external speaker hole 107 and the receiver hole 114 for a telephone call. In some embodiments, the speaker holes 107 and 114 and the microphone hole 103 may be implemented with a single hole, or without the speaker holes 107 and 114, a speaker may be included (e.g., a piezo speaker).

The sensor modules 104, 116, and 119 may generate an electrical signal or a data value that corresponds to an operational state inside the electronic device 100 or an environmental state external to the electronic device 100. The sensor modules 104, 116, and 119 may include, for example, the first sensor module 104 (e.g., a proximity sensor) and/or the second sensor module (not illustrated) (e.g., a fingerprint sensor) that is disposed on the first surface 110A of the housing 110, and/or the third sensor module 119 (e.g., an HRM sensor) and/or the fourth sensor module 116 (e.g., a fingerprint sensor) that is disposed on the second surface 110B of the housing 110. The fingerprint sensor may be disposed not only on the first surface 110A of the housing 110 (e.g., the display 101) but also on the second surface 110B. The electronic device 100 may further include a non-illustrated sensor module, for example, at least one of a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, or an illuminance sensor 104.

The camera modules 105, 112, and 113 may include the first camera device 105 disposed on the first surface 110A of the electronic device 100, and the second camera device 112 and/or the flash 113 disposed on the second surface 110B. The camera devices 105 and 112 may include one or more lenses, an image sensor, and/or an image signal processor. The flash 113 may include, for example, a light emitting diode or a xenon lamp. In some embodiments, two or more lenses (an IR camera lens, a wide angle lens, and a telephoto lens) and image sensors may be disposed on one surface of the electronic device 100.

The key input devices 117 may be disposed on the side surfaces 110C of the housing 110. In another embodiment, the electronic device 100 may not include all or some of the aforementioned key input devices 117, and the key input devices 117 not included may be implemented in a different form, such as a soft key, on the display 101. In some embodiments, the key input devices may include the sensor module 116 disposed on the second surface 110B of the housing 110.

The light emitting element 106, for example, may be disposed on the first surface 110A of the housing 110. The light emitting element 106, for example, may provide state information of the electronic device 100 in the form of light. In another embodiment, the light emitting element 106 may provide, for example, a light source that operates in conjunction with operation of the camera module 105. The light emitting element 106 may include, for example, an LED, an IR LED, and a xenon lamp.

The connector holes 108 and 109 may include the first connector hole 108 capable of receiving a connector (e.g., a USB connector) for transmitting and receiving electric power and/or data with an external electronic device, and/or the second connector hole (e.g., an earphone jack) 109 capable of receiving a connector for transmitting and receiving audio signals with an external electronic device.

Referring to FIG. 3, the electronic device 100 may include a side member 140, a first support member 141 (e.g., a bracket), a front plate 120, a display 130, a printed circuit board 150, a battery 190, a second support member 160 (e.g., a rear case), an antenna 170, and a back plate 180. In some embodiments, the electronic device 100 may omit at least one component (e.g., the first support member 141 or the second support member 160) among the aforementioned components, or may additionally include other component (s). At least one of the components of the electronic device 100 may be the same as, or similar to, at least one of the components of the electronic device 100 of FIG. 1 or FIG. 2, and repetitive descriptions will hereinafter be omitted.

The first support member 141 may be disposed inside the electronic device 100 and may be connected with the side member 140, or may be integrally formed with the side member 140. The first support member 141 may be formed of, for example, a metallic material and/or a nonmetallic (e.g., polymer) material. The display 130 may be coupled to one surface of the first support member 141, and the printed circuit board 150 may be coupled to an opposite surface of the first support member 141. A processor, a memory, and/or an interface may be mounted on the printed circuit board 150. The processor may include, for example, one or more of a central processing unit, an application processor, a graphic processing unit, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, an SD card interface, and/or an audio interface. The interface, for example, may electrically or physically connect the electronic device 100 with an external electronic device and may include a USB connector, an SD card/MMC connector, or an audio connector.

The battery 190, which is a device for supplying electric power to at least one component of the electronic device 100, may include, for example, a primary cell that is not rechargeable, a secondary cell that is rechargeable, or a fuel cell. At least part of the battery 190, for example, may be disposed on substantially the same plane as the printed circuit board 150. The battery 190 may be integrally disposed inside the electronic device 100, or may be disposed so as to be detachable from the electronic device 100.

The antenna 170 may be disposed between the back plate 180 and the battery 190. The antenna 170 may include, for example, a near field communication (NFC) antenna, a wireless charging antenna, and/or a magnetic secure transmission (MST) antenna. The antenna 170, for example, may perform short-range communication with an external device, or may wirelessly transmit and receive electric power required for charging. In another embodiment, an antenna structure may be formed by part of the side member 140 and/or part of the first support member 141, or a combination thereof.

Figure 4:
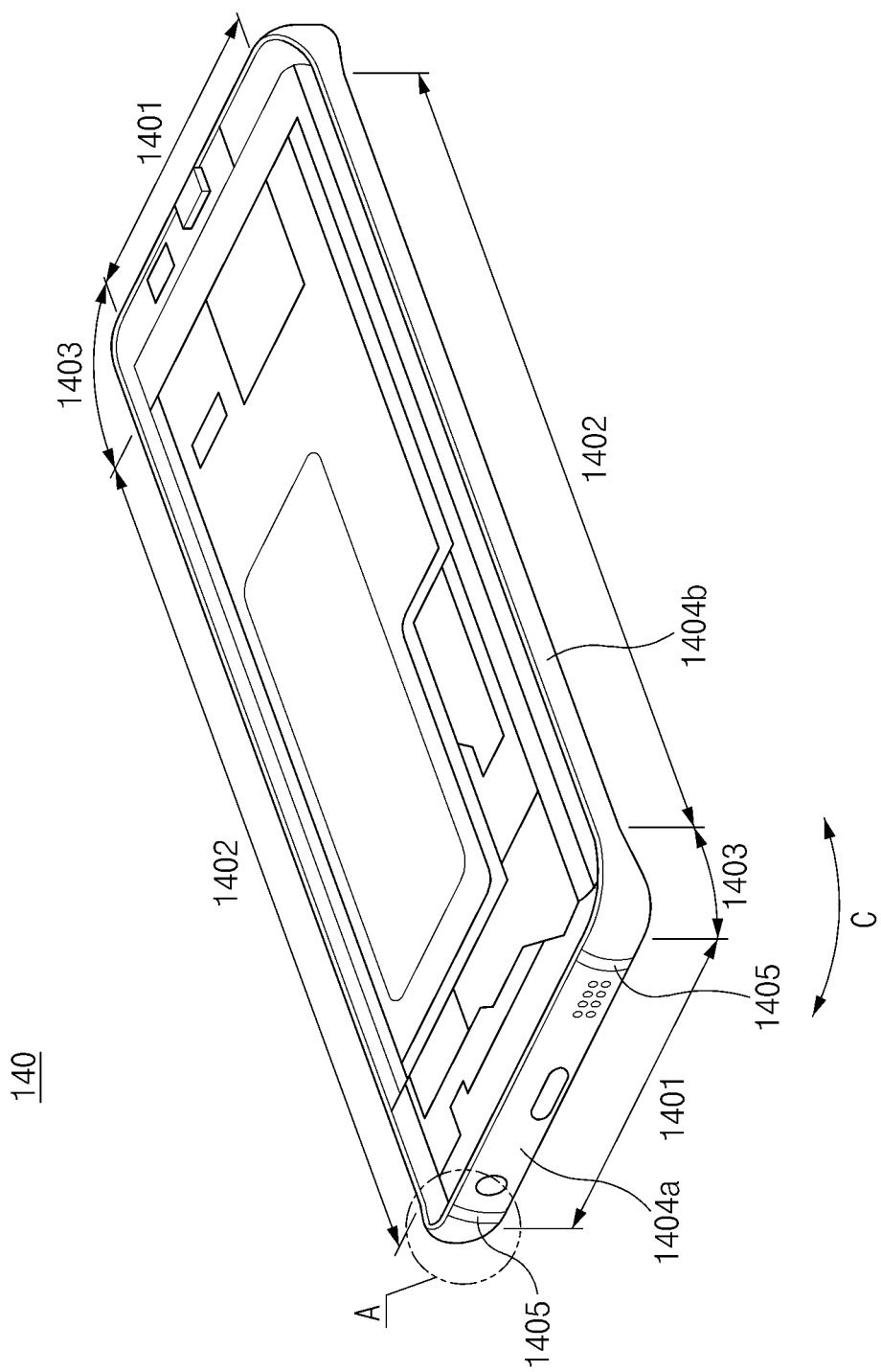
FIG. 4 is a perspective view illustrating a side member of the electronic device according to an embodiment.

FIG. 4 is a view illustrating the side member 140 of the electronic device 100 according to an embodiment.

In an embodiment, the electronic device 100 may include the side member 140 that forms part of an outer surface (e.g., the side surface) of the electronic device 100. In some embodiments, the outer surface may be, or may include, a third surface between a first surface formed by the first plate 120 and a second surface formed by the second plate 180. The side member 140 may contain a metallic material (e.g., metal). The metallic material may include aluminum.

Hereinafter, in describing the side member 140, a direction of surrounding the space between the first plate 120 and the second plate 180 around the z-axis will be referred to as a circumferential direction C of the side member 140.

In an embodiment, the side member 140 may include short side portions 1401 extending in the x-axis direction, long side portions 1402 extending in the y-axis direction, and corner portions 1403 formed between the short side portions 1401 and the long side portions 1402 to connect the short side portions 1401 and the long side portions 1402. In the illustrated embodiment, the short side portions 1401 may extend by a first length, and the long side portions 1402 may extend by a second length greater than the first length.

In some embodiments, the side member 140 may include insulating portions 1405 formed of an insulating material and metal portions 1404a and 1404b formed of a metallic material. The insulating portions 1405 may insulate the metal portions 1404a formed between the insulating portions from the remaining metal portions 1404b. Referring to FIG. 4, the insulating portions 1405 may be formed in the short side portions 1401. However, without being limited thereto, the insulating portions 1405 may be formed in the long side portions 1402 or the corner portions 1403.

In various embodiments, the short side portions 1401 may have a greater thickness than the long side portions 1402. Here, the thickness may be the height in a direction (e.g., the z-axis direction) perpendicular to the circumferential direction. The thicknesses of the short side portions 1401 and the long side portions 1402 may be related to the curvatures of peripheral portions of the first plate 120 and/or the second plate 180. When peripheral portions of the first plate 120 that are adjacent to the short side portions 1401 have a greater curvature than peripheral portions of the first plate 120 that are adjacent to the long side portions 1402, the short side portions 1401 may have a smaller thickness than the long side portions 1402. Accordingly, in embodiments of the disclosure, the shapes of the short side portions 1401 and the long side portions 1402 of the side member 140 are not limited to those illustrated in the drawing.

Figure 5:
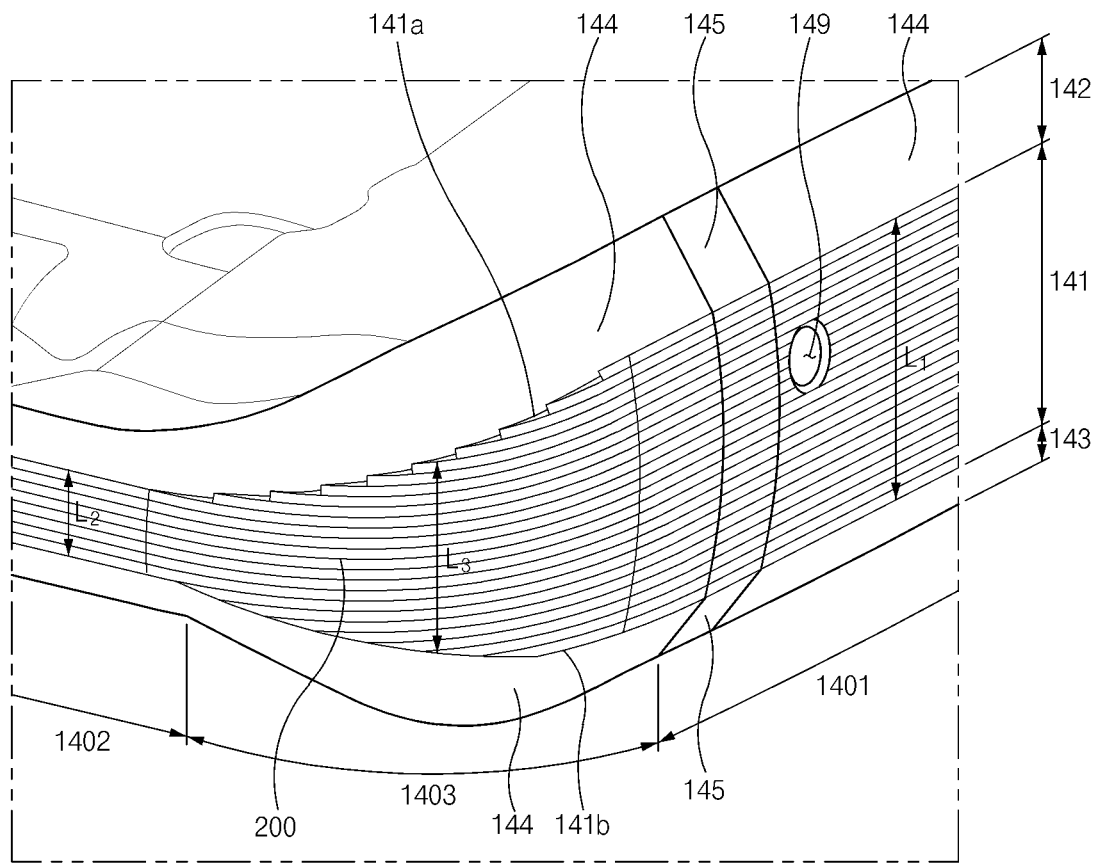
FIG. 5 is a view illustrating part of the side member of the electronic device according to an embodiment.

FIG. 5 is a view illustrating part of the side member 140 of the electronic device 100 according to an embodiment. FIG. 5 is a blowup of portion A in FIG. 4.

Referring to FIG. 5, the side member 140 may include a patterned region 141 having a pattern 200 formed thereon, a first region 142 formed on one side of the patterned region 141, and a second region 143 formed on an opposite side of the patterned region 141. The first region 142 may be formed between a first plate (e.g., the first plate 120 of FIG. 3) and the patterned region 141. The second region 143 may be formed between a second plate (e.g., the second plate 180 of FIG. 3) and the patterned region 141.

In the illustrated embodiment, the pattern 200 formed on the patterned region 141 may be formed along the circumferential direction of the side member 140. The patterned regions 141 included in the long side portions 1402 may have a smaller width than the patterned regions 141 included in the short side portions 1401. Here, the width may be understood as the length by which the patterned region 141 extends along an outer surface of the side member 140 from a first edge 141a formed by the patterned region 141 and the first region 142 to a second edge 141b formed by the patterned region 141 and the second region 143. As illustrated in FIG. 5, the patterned regions 141 included in the corner portions 1403 may have a decreasing width from the patterned regions 141 included in the short side portions 1401 toward the patterned regions 141 included in the long side portions 1402.

As described above with reference to FIG. 4, the short side portions 1401 of the side member 140 may have a greater thickness than the long side portions 1402 of the side member 140. Here, the thickness may be the height in a direction (e.g., the z-axis direction) perpendicular to the circumferential direction of the side member.

In various embodiments, the patterned region 141 may have a width of a predetermined percentage of the thickness of each of the portions 1401, 1402, and 1403 of the side member 140. For example, because the short side portions 1401 of the side member 140 have a greater thickness than the long side portions 1402, the patterned regions 141 included in the short side portions 1401 of the side member 140 may also have a greater width than the patterned regions 141 included in the long side portions 1402.

In various embodiments, the widths of the patterned regions 141 included in the short side portions 1401, the long side portions 1402, and the corner portions 1403 of the side member 140 may vary depending on the curvatures of peripheral portions of the first plate (e.g., the first plate 120 of FIG. 3) and/or the second plate (e.g., the second plate 180 of FIG. 3) and are not limited to those illustrated in the drawing.

In various embodiments, the outer surface formed by the side member 140 may include metal regions 144 formed of a conductive material (e.g., a metallic material) and insulating regions 145 formed of an insulating material.

In the illustrated embodiment, the insulating regions 145 may be formed to cross the first region 142, the second region 143, and the patterned region 141. For example, the insulating regions 145 may extend along the outer surface of the side member 140 in a direction perpendicular to the circumferential direction. Referring to FIG. 5, the insulating regions 145 may be formed in the short side portions 1401 of the side member 140. However, without being necessarily limited thereto, the insulating regions 145 may be formed in the long side portions 1402 or the corner portions 1403.

In some embodiments, the side member 140 may include metal portions (e.g., the metal portions 1404a and 1404b of FIG. 4) that are formed of a metallic material and insulating portions (e.g., the insulating portions 1405 of FIG. 3) that are formed of an insulating material and that insulate a part of the metal portions. In this case, the metal portions 1404a and 1404b may form the metal regions 144 on the outer surface of the side member 140, and the insulating portions 1405 may form the insulating regions 145 on the outer surface of the side member 140.

Figure 6:
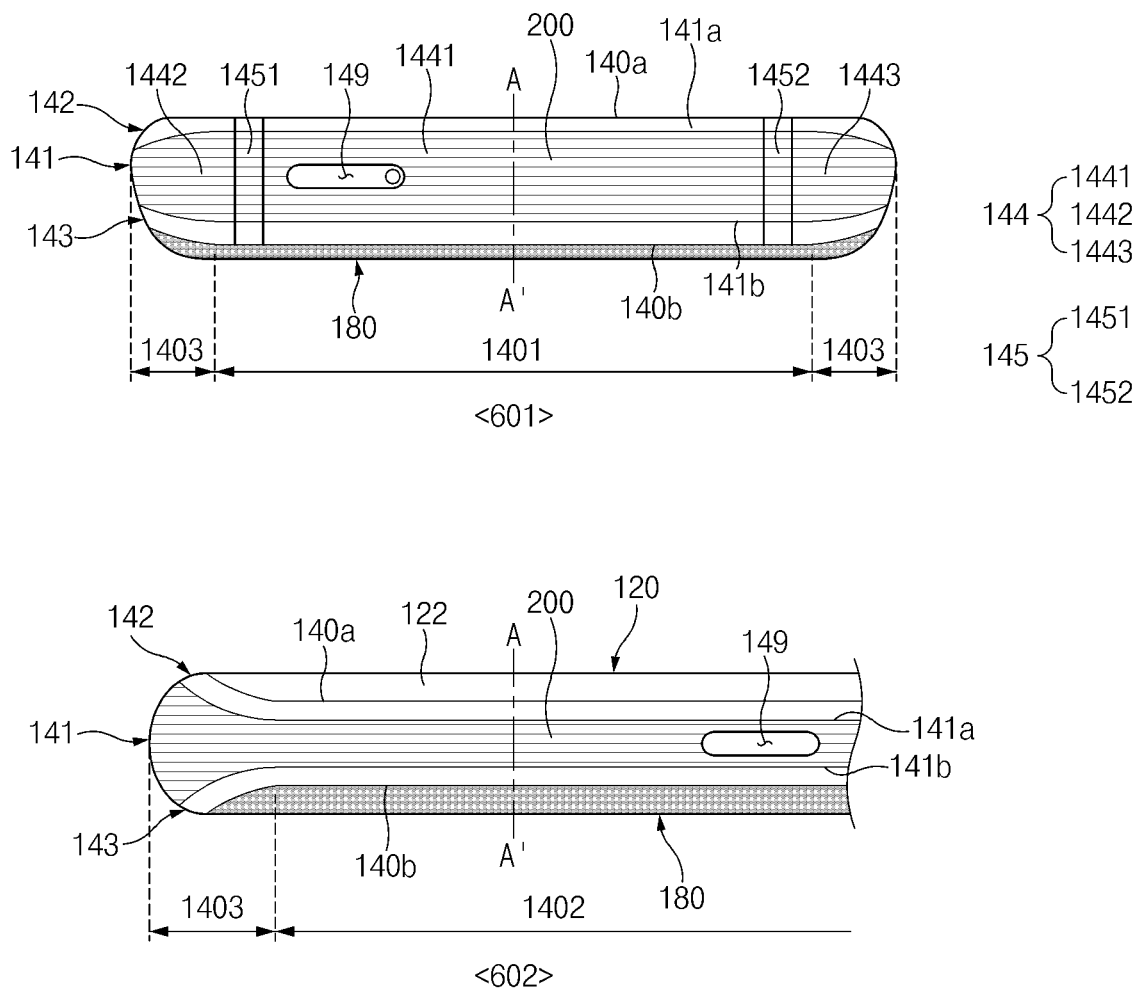
FIG. 6 is a side view illustrating the shielding member of the electronic device according to an embodiment.

FIG. 6 is a view illustrating the side member 140 of the electronic device 100 according to an embodiment.

Referring to FIG. 6, the outer surface of the electronic device 100 formed by the side member 140 may include the insulating regions 145 formed of an insulating material and the metal regions 144 formed of a conductive material (e.g., a metallic material). In the illustrated embodiment, the insulating regions 145 may be formed in the short side portions 1401.

In the illustrated embodiment, the insulating regions 145 may extend from a first edge 140a of the first region 142 adjacent to the first plate 120 to a second edge 140b of the second region 143 adjacent to the second plate 180 through the patterned region 141. The insulating regions 145 may have a thickness substantially corresponding to the thickness of the side member 140 to electrically insulate the remaining regions (e.g., the metal regions 144) of the side member 140 that are formed on opposite sides of the insulating regions 145. That is, the insulating regions 145 may extend in a direction substantially perpendicular to the circumferential direction of the side member 140 and may cross the side member 140 from the one edge 140a of the side member 140 to the opposite edge 140b thereof.

In an embodiment, the metal regions 144 may include a first metal region 1441, a second metal region 1442 formed on one side of the first metal region 1441 in the circumferential direction, and a third meal region 1443 formed on an opposite side of the first metal region 1441. The insulating regions 145 may be formed between the first metal region 1441 and the second metal region 1442 and between the first metal region 1441 and the third metal region 1443.

In an embodiment, the insulating regions 145 may include a first insulating region 1451 formed between the first metal region 1441 and the second metal region 1442 and a second insulating region 1452 formed between the first metal region 1441 and the third metal region 1443. The first insulating region 1451 and the second insulating region 1452 may electrically insulate the first metal region 1441 from the second metal region 1442 and the third metal region 1443. In some embodiments, the first metal region 1441 may include a conductive region that forms an antenna.

In an embodiment, the patterned region 141 including the pattern 200 may be formed across the metal regions 144 and the insulating regions 145. The patterned region 141 may be formed to cross the metal regions 144 and the insulating regions 145 along the circumferential direction of the side member 140. In the illustrated embodiment, the pattern formed on the second metal region 1442 may be continuously formed to the first metal region 1441 through the first insulating region 1451. Likewise, the pattern formed on the first metal region 1441 may continuously extend to the third metal region 1443 through the second insulating region 1452. Here, when the pattern continuously extends, it may mean that structures (e.g., valleys and ridges) forming the pattern are integrally formed and have a continuous shape.

In various embodiments, the side member 140 may include an opening 149 formed in the patterned region 141. The opening 149 may be formed in the patterned region 141 included in at least one of the short side portions 1401, the long side portions 1402, or the corner portions 1403. In various embodiments, the opening 149 is not necessarily limited to being formed in the patterned region 141 and may be formed in another region (e.g., the first region 142 or the second region 143). Alternatively, part of the opening 149 may be formed in the patterned region 141, and the remaining part may be formed in another region (e.g., the first region 142 or the second region 143).

In some embodiments, the side member 140 may include the outer surface that forms the third surface of the electronic device 100. The outer surface may include the first edge 140a adjacent to the first plate 120, the second edge 140b adjacent to the second plate 180, and the patterned region 141 that is formed between the first edge 140a and the second edge 140b and that includes the pattern. In addition, the outer surface may further include the first region 142 formed between the patterned region 141 and the first edge 140a and the second region 143 formed between the patterned region 141 and the second edge 140b. The first region 142 may form the first edge 141a with the patterned region 141, and the second region 143 may form the second edge 141b with the patterned region 141.

FIG. 7 is a view illustrating the side member 140 of the electronic device 100 according to various embodiments.

Referring to FIG. 7, patterns 210 and 220 may include protruding ridges 213, valleys 212 located between the ridges 213, and inclined surfaces 214 connecting the ridges 213 and the valleys 212. Each of the ridges 213 and/or the valleys 212 may be formed to be an edge that two adjacent inclined surfaces 214 meet to form. The extension direction of the edge may be referred to as the extension direction of the patterns 210 and 220 (the direction of an arrow illustrated in the drawing).

Figure 7A:
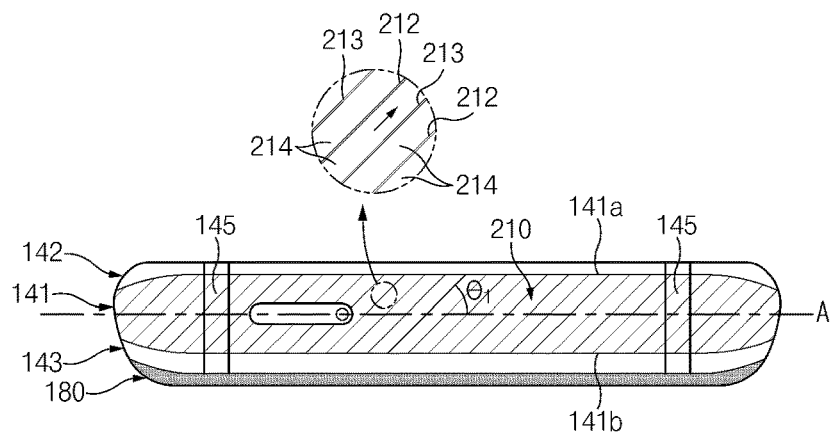
FIG. 7 is a sectional view of the side member of the electronic device according to an embodiment.
Figure 7A:
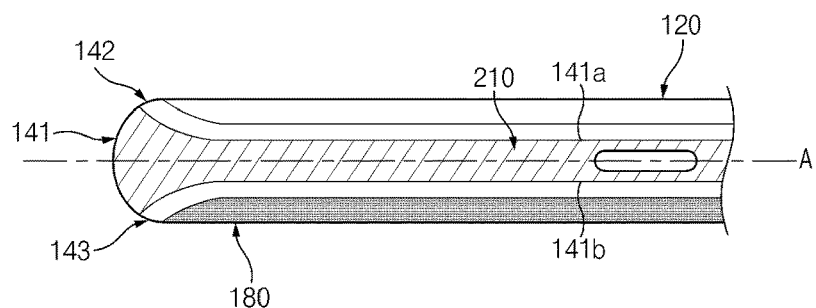

Referring to FIG. 7A, the side member 140 may have a central axis A spaced apart from the first edge 141a, which is formed by the patterned region 141 and the first region 142, and the second edge 141b, which is formed by the patterned region 141 and the second region 143, at the same interval. The central axis A may be the same as the circumferential direction C of the side member 140 illustrated in FIG. 4.

Referring to FIG. 7A, the side member 140 may include the first pattern 210 extending in a direction inclined at a first angle θ1 with respect to the central axis A of the side member 140.

Figure 7B:
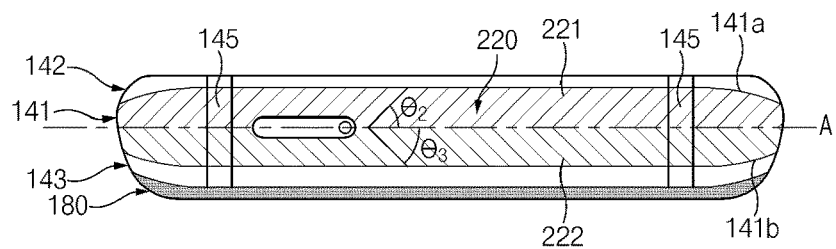
Figure 7B:
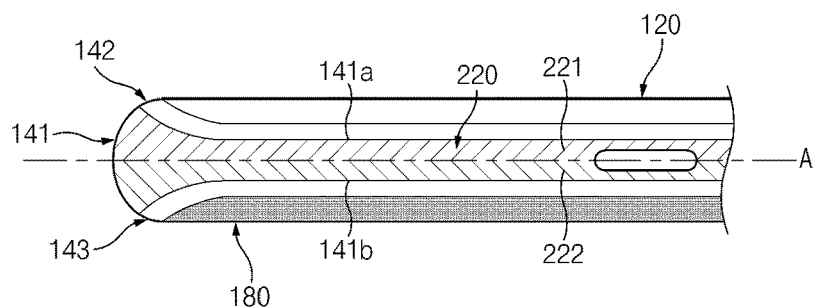

Referring to FIG. 7B, the side member 140 may include the second pattern 220 that includes a first sub-pattern 221 extending at a second angle θ2 with respect to the central axis A of the side member 140 and a second sub-pattern 222 extending at a third angle θ3 with respect to the circumferential direction of the side member 140.

In the illustrated embodiment, the second angle θ2 and the third angle θ3 may be the same as each other. The first sub-pattern 221 and the second sub-pattern 222 may be formed to be symmetric to each other with respect to the central axis of the side member 140.

Patterns according to embodiments of the disclosure are not limited to the form in which the first sub-pattern and the second sub-pattern cross each other at the central axis as illustrated in the drawing. For example, a pattern according to various embodiments may be formed such that a first sub-pattern and a second sub-pattern having a predetermined angle with respect to a central axis are asymmetrical with respect to the central axis (e.g., sub-patterns cross each other at another axis spaced apart from the central axis).

Figure 8:
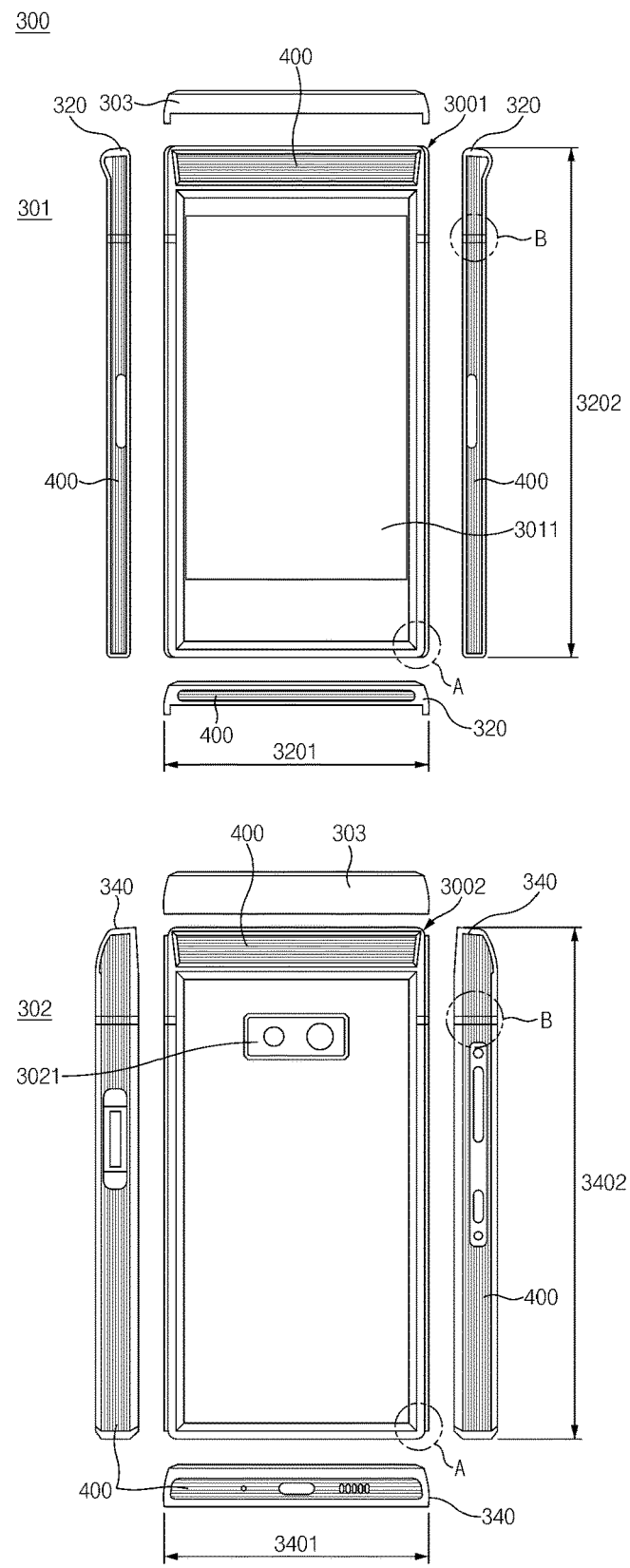
FIG. 8 is a side view illustrating side members of an electronic device according to various embodiments.

FIG. 8 is a development view of an electronic device 300 according to various embodiments.

Referring to FIG. 8, the electronic device 300 according to various embodiments may include a folded state in which a display area 3011 formed on a first housing 301 and a camera area 3021 formed on a second housing 302 are disposed to face away from each other and a flat state in which the display area 3011 and the camera area 3021 are disposed to face the same direction.

In the illustrated embodiment, the electronic device 300, in the folded state, may include a first surface 3001 on which the display area 3011 is formed, a second surface 3002 that faces away from the first surface 3001 and on which the camera area 3021 is formed, and a third surface 3003 that is formed between the first surface 3001 and the second surface 3002 and that has a pattern 400 formed on at least part thereof. The pattern 400 may be formed on at least part of the first surface 3001 and at least part of the second surface 3002.

The electronic device 300 according to various embodiments may include the first housing 301, the second housing 302, and a hinge housing 303 including a hinge structure therein. The first housing 301 and the second housing 302 may be connected by the hinge structure so as to be rotatable relative to each other.

The first housing 301 may include a first side member 320 that forms part of the side surface 3003 of the electronic device 300 in the folded state. The second housing 302 may include a second side member 340 that forms part of the side surface 3003 of the electronic device 300 in the folded state.

The hinge housing 303 may form part of the side surface 3003 of the electronic device 300 in the folded state.

As illustrated in FIG. 8, the first side member 320 of the first housing 301 may include the pattern 400. The first side member 320 of the first housing 301 may include short side portions 3201 extending by a first length, long side portions 3202 extending by a second length greater than the first length, and corner portions 3203 connecting the short side portions 3201 and the long side portions 3202.

As illustrated in FIG. 8, the second side member 340 of the second housing 302 may include the pattern 400. The second side member 340 of the second housing 302 may include short side portions 3401 extending by the first length, long side portions 3402 extending by the second length greater than the first length, and corner portions 3403 connecting the short side portions 3401 and the long side portions 3402.

Figure 9:
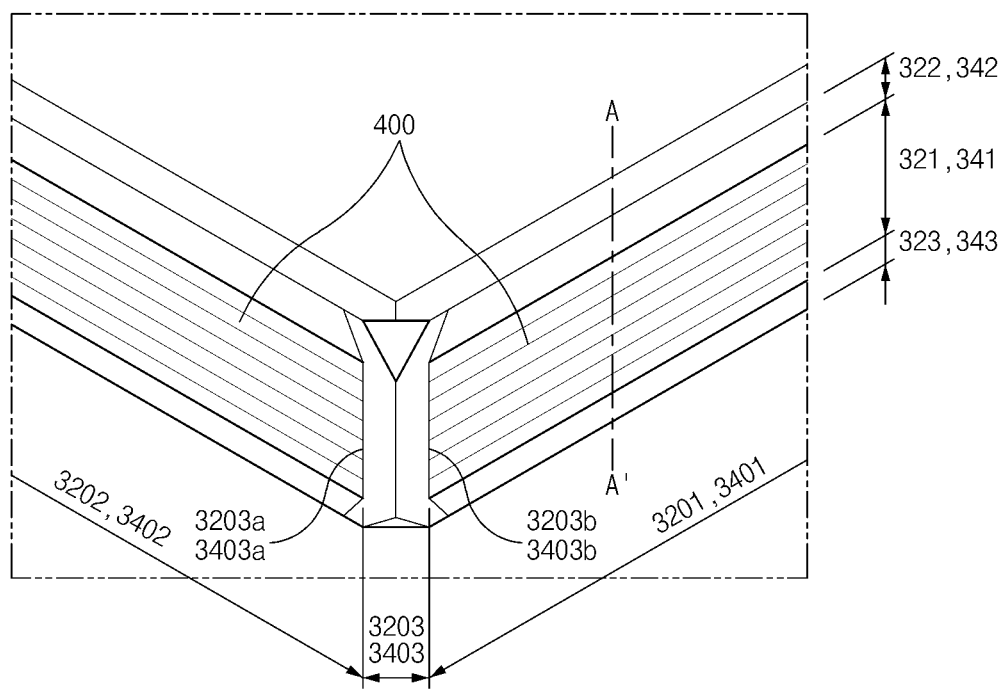
FIG. 9 is a view illustrating patterns formed on the side members of the electronic device according to various embodiments.

FIG. 9 is a view illustrating the first side member 320 of the first housing 301 and the second side member 340 of the second housing 302 of the electronic device 300 according to various embodiments. FIG. 9 is a blowup of portion A in FIG. 8.

Referring to FIG. 9, the first side member 320 may include a patterned region 321 having the pattern 400 formed thereon, a first region 322 formed on one side of the patterned region 321, and a second region 323 formed on an opposite side of the patterned region 321.

Referring to FIG. 9, the second side member 340 may include a patterned region 341 having the pattern 400 formed thereon, a first region 342 formed on one side of the patterned region 341, and a second region 343 formed on an opposite side of the patterned region 341.

In the illustrated embodiment, the first regions 321 and 341 and the second regions 322 and 342 included in the first side member 320 and the second side member 340 may be formed from the short side portions 3201 and 3401 to the long side portions 3202 and 3402 across the corner portions 3203 and 3403.

In contrast, the patterned regions 321 and 341 included in the first side member 320 and the second side member 340 may be formed on the short side portions 3201 and 3401 and the long side portions 3202 and 3402, but may not be formed on the corner portions 3203 and 3403. That is, the pattern 400 may extend from first end portions 3203a and 3204a of the corner portions 3203 and 3403 in a first direction to form the patterned regions 321 and 341 on the short side portions 3201 and 3401 and may extend from second end portions 3203b and 3204b of the corner portions 3203 and 3403 in a second direction to form the patterned regions 321 and 341 on the long side portions 3202 and 3402.

In various embodiments, the widths of the patterned regions 321 and 341 included in the short side portions 3201 and 3401 may substantially correspond to the widths of the patterned regions 321 and 341 included in the long side portions 3202 and 3402.

Figure 10:
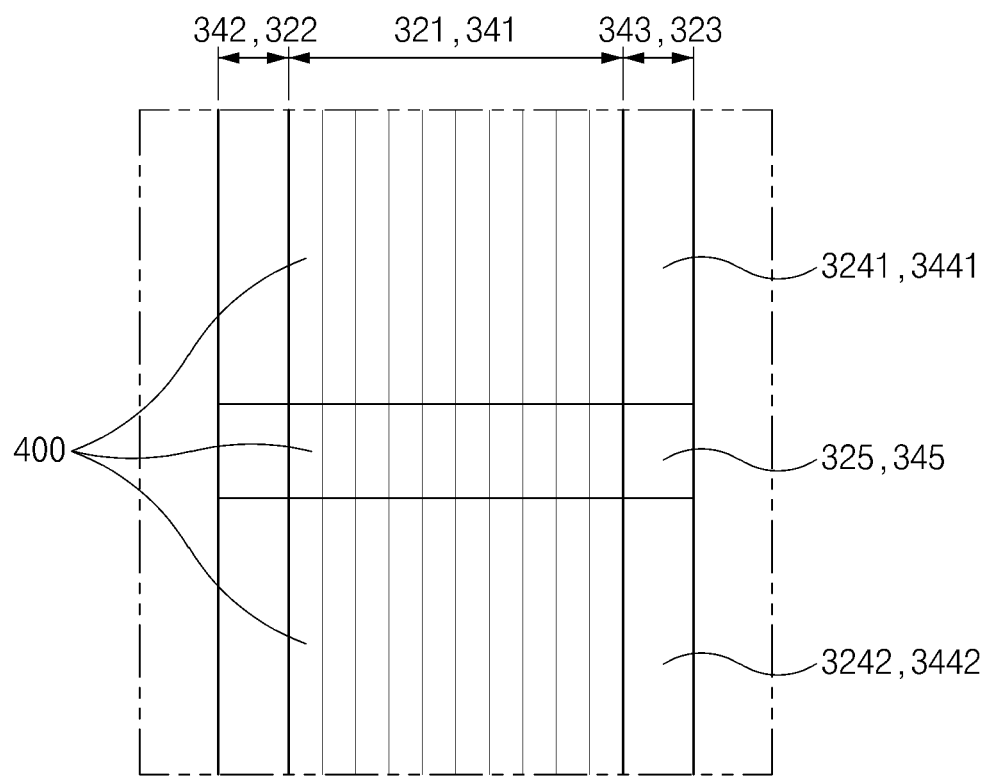
FIG. 10 is a view illustrating insulating regions and of the electronic device according to various embodiments.

FIG. 10 is a view illustrating insulating regions 325 and 345 of the electronic device 300 according to various embodiments. FIG. 10 is a blowup of portion B in FIG. 8.

Referring to FIG. 10, an outer surface of the electronic device 300 formed by the side members 320 and 340 may include the insulating regions 325 and 345 formed of an insulating material and metal regions 3241, 3242, 3441, and 3442 formed of a metallic material. Referring to FIG. 8, the insulating regions 325 and 345 may be formed on the long side portions 3201 and 3401. However, without being necessarily limited thereto, the insulating regions 325 and 345 may be formed on the short side portions 3202 and 3402 or the corner portions 3203 and 3403.

In the illustrated embodiment, the insulating regions 325 and 345 may be formed across the side members 320 and 340 to insulate the first metal regions 3241 and 3441 and the second metal regions 3242 and 3442.

In an embodiment, metal regions 324 and 344 may include the first metal regions 3241 and 3441 formed on one side of the insulating regions 325 and 345 and the second metal regions 3242 and 3442 formed on an opposite side of the insulating regions.

In an embodiment, the patterned regions 321 and 341 including the pattern 400 may be formed across the metal regions 324 and 344 and the insulating regions 325 and 345. The patterned regions 321 and 341 may be formed across the metal regions 324 and 344 and the insulating regions 325 and 345 along the circumferential direction of the side members 320 and 340. In the illustrated embodiment, the patterns formed on the second metal regions 3242 and 3442 may be continuously formed to the first metal regions 3241 and 3441 through the insulating regions 325 and 345. Here, when the pattern 400 continuously extends, it may mean that structures (e.g., valleys and ridges) forming the pattern 400 are integrally formed and have a continuous shape.

In various embodiments, the side members 320 and 340 may have openings formed therein. The openings may be formed in at least one of the short side portions 320 and 3401, the long side portions 320 and 3402, or the corner portions 320 and 3403. In various embodiments, the openings may be formed in the patterned regions 321 and 341. However, without being limited thereto, the openings may be formed in other regions (e.g., the first regions 322 and 342 or the second regions 323 and 343). Alternatively, parts of the openings may be formed in the patterned regions 321 and 341, and the remaining parts of the openings may be formed in other regions (e.g., the first regions 321 and 341 or the second regions 323 and 343).

Figure 11:
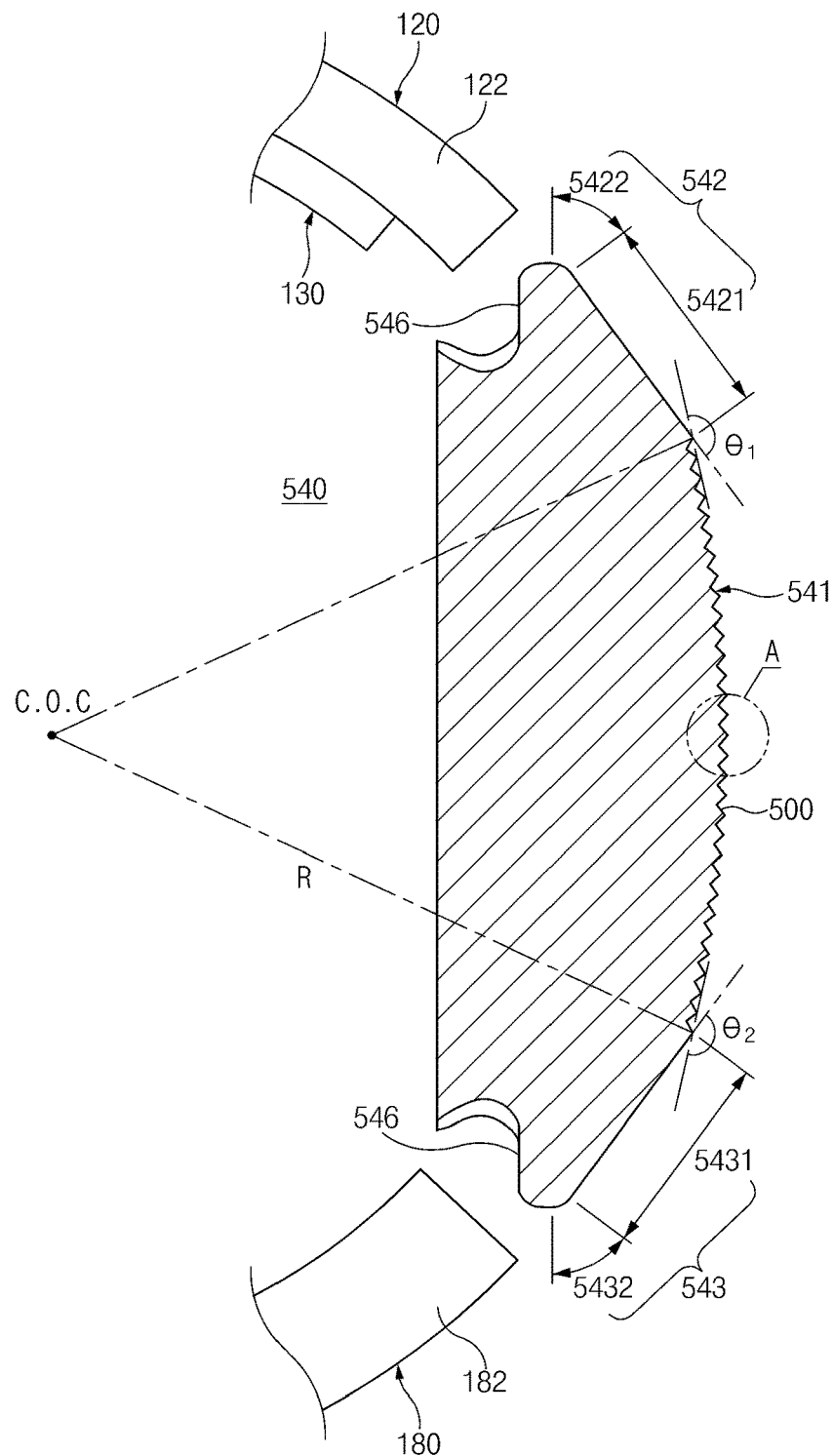
FIG. 11 is a sectional view of a side member of the electronic device according to an embodiment.

FIG. 11 is a sectional view of a side member 540 of the electronic device 100 or 200 according to an embodiment. FIG. 11 is a sectional view taken along line A-A' illustrated in FIG. 6 or 9.

Here, the side member 540 may include the side member 140 illustrated in FIGS. 4 to 7 or the side member 320 or 340 illustrated in FIGS. 8 to 10. A pattern 500 may include the pattern 200 illustrated in FIGS. 4 to 7 or the pattern 400 illustrated in FIGS. 8 to 10.

Here, a patterned region 541 may include the patterned region 141 illustrated in FIGS. 4 to 7 or the patterned region 321 or 341 illustrated in FIGS. 8 to 10. A first region 542 may include the first region 142 illustrated in FIGS. 4 to 7 or the first region 322 or 342 illustrated in FIGS. 8 to 10. A second region 543 may include the second region 143 illustrated in FIGS. 4 to 7 or the second region 323 or 343 illustrated in FIGS. 8 to 10.

Referring to FIG. 11, the side member 540 may be formed between the first plate 120 and the second plate 180. In various embodiments, the first plate 120 may form the first surface of the electronic device 100 or 200, the second plate 180 may form the second surface of the electronic device 100 or 200, and the side member 540 may form the third surface between the first surface and the second surface of the electronic device 100 or 200. Peripheral portions 122 and 182 of the first plate 120 and the second plate 180 may include a curved surface.

An outer surface of the side member 540 may include the patterned region 541 including the pattern 500, the first region 542 extending from the patterned region 541 toward the peripheral portion 122 of the first plate 120, and the second region 543 extending from the patterned region 541 toward the peripheral portion 182 of the second plate 180.

The patterned region 541 may include a curved surface having a predetermined curvature. The curved surface may be formed to be convex toward the outside of the electronic device 100 or 200. That is, the curved surface may be formed such that the center of curvature (C.O.C) is located inside the electronic device 100 or 200 with respect to the patterned region 541 (e.g., in the space between the first plate and the second plate or in the housing).

In various embodiments, the first region 542 and the second region 543 may each include a flat surface. Portions of the first region 542 and the second region 543 that are adjacent to the patterned region 541 may be formed to be flat surfaces.

In the illustrated embodiment, the first region 542 may include region 1-1 5421 adjacent to the patterned region 541 and region 1-2 5422 adjacent to the periphery of the first plate 120. Region 1-1 5421 may be formed to be a flat surface. Region 1-2 5422 may be connected with an inner surface 546 of the side member 540 that faces the first plate 120.

In various embodiments, region 1-1 5421 is not necessarily limited to being formed to be a flat surface. For example, region 1-1 5421 may be formed to be a curved surface connecting region 1-2 5422 and the patterned region 541. In some embodiments, the curved surface may have a different curvature from the patterned region 541.

In the illustrated embodiment, the second region 543 may include region 2-1 5431 adjacent to the patterned region 541 and region 2-2 5432 adjacent to the periphery of the second plate 180. Region 2-1 5431 may be formed to be a flat surface. Region 2-2 5432 may be connected with an inner surface 546 of the side member 540 that faces the second plate 180.

In various embodiments, region 2-1 5431 is not necessarily limited to being formed to be a flat surface. For example, region 2-1 5431 may be formed to be a curved surface connecting region 2-2 5432 and the patterned region 541. In some embodiments, the curved surface may have a different curvature from the patterned region 541.

In various embodiments, region 1-1 5421 and/or region 2-1 5431 may be formed to be a curved surface. The curved surface may have a different curvature from the curved surface of the patterned region 541. For example, region 1-1 5421 may have a first curvature, region 2-1 5431 may have a second curvature, and the patterned region 541 may have a third curvature. The first curvature and the second curvature may be greater than the third curvature. Furthermore, the first curvature and the second curvature may be the same as each other.

In various embodiments, the patterned region 541 may be connected with the first region 542 to form a first angle θ1. The angle formed by the first region 542 and the patterned region 541, when viewed in the sectional view, may be an angle between a line extending in a tangential direction from an end portion of the curved surface of the first patterned region 541 and a line extending from an end portion of the first region 542. Alternatively, the angle may be an angle between a normal vector to the end portion of the first region 542 and a normal vector to the end portion of the first patterned region 541.

In various embodiments, the patterned region 541 may be connected with the second region 543 to form a second angle θ2. The angle formed by the first region 542 and the patterned region 541, when viewed in the sectional view, may be an angle between a line extending in a tangential direction from an end portion of the curved surface of the first patterned region 541 and a line extending from an end portion of the first region 542. Alternatively, the angle may be an angle between a normal vector to the end portion of the first region 542 and a normal vector to the end portion of the first patterned region 541.

A side member may include an aluminum containing body and an aluminum oxide containing film formed on a surface of the body. A pattern may be formed on the body through CNC machining before the film is formed. The film may prevent corrosion of the aluminum body. When the angles (e.g., the first angle θ1 and the second angle θ2) between a patterned region (e.g., the patterned region 541) and regions (e.g., the first region 542 and the second region 543) extending from the patterned region are small, the film may be easily separated (delaminated) from the aluminum body, and corrosion of the aluminum body may proceed. Particularly, the film may be easily separated (delaminated) from the edge portion formed by region 1-1 5421 and the patterned region 541 and the edge portion formed by region 2-1 5431 and the patterned region 541.

In contrast, the electronic device 100 or 200 according to various embodiments may include the side member 540 in which the patterned region 541 is formed to be a curved surface and is connected, at relatively large angles, with regions (e.g., the first region 542 and the second region 543) extending from the patterned region 541. Thus, the electronic device 100 or 200 may have an advantageous effect that a film is not easily separated from a body.

FIG. 12 is a view illustrating patterns 610 and 620 formed on the side member of the electronic device 100 or 200 according to various embodiments.

Here, the patterns 610 and 620 may include the pattern 200 illustrated in FIGS. 4 to 7 or the pattern 400 illustrated in FIGS. 8 to 10.

Referring to FIG. 12, the patterns 610 and 620 may include a plurality of valleys 612 formed in positions spaced apart from the center of curvature by a first distance R1 and a plurality of ridges 613 spaced by a second distance R2 greater than the first distance R1. A first surface 611 connecting the plurality of valleys 612 may be formed in the patterns 610 and 620. The distance from the first surface 611 to the ridges 613 in the radial direction may be referred to as the height of the patterns 610 and 620, and the distance between two adjacent valleys 612 may be referred to as the pitch of the patterns 610 and 620.

Figure 12A:
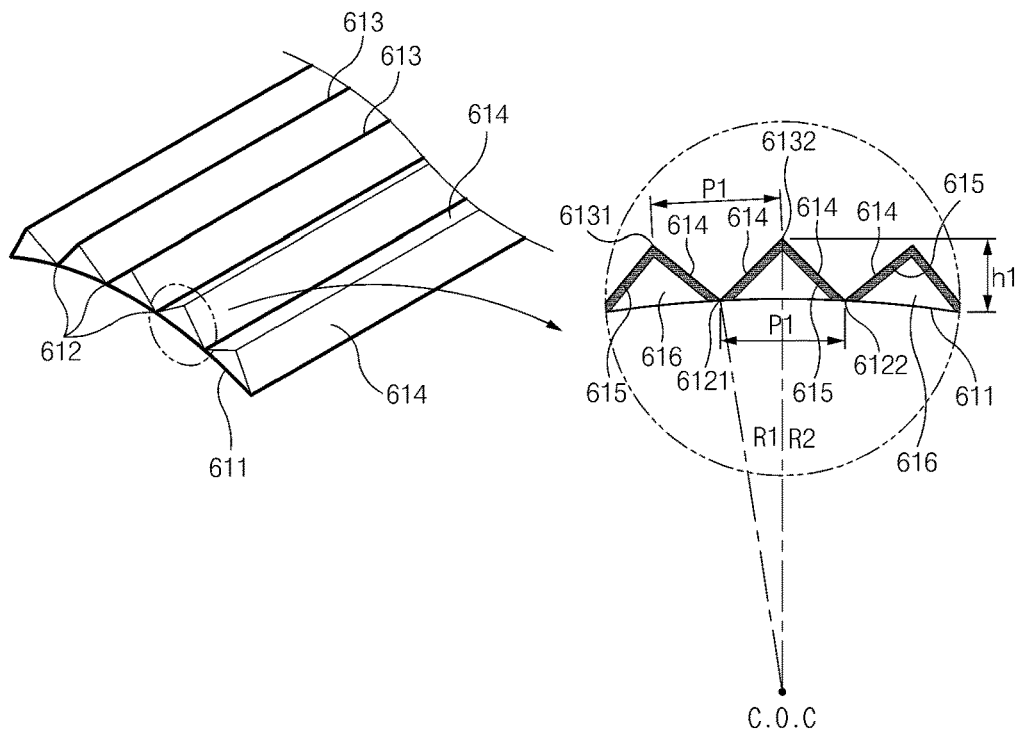
FIG. 12 is a view illustrating patterns formed on the side member of the electronic device according to various embodiments.

Referring to FIG. 12A, the first pattern 610 may include valleys 6121 and 6122 spaced apart from the center of curvature (C.O.C) by the first distance R1 and the ridges 613 spaced by the second distance R2. The first pattern 610 may have a first height h1 corresponding to the difference between the first distance R1 and the second distance R2. The two adjacent valleys 6121 and 6122 may form a first pitch P1. Likewise, two adjacent ridges 6131 and 6132 may form the first pitch P1. In various embodiments, the first height h1 may range from 0.03 mm to 0.15 mm.

The first pattern 610 may include the first valley 6121 and the second valley 6122 adjacent to the first valley 6121. The first pattern 610 may include the second ridge 6132 formed between the first valley 6121 and the second valley 6122 and the first ridge 6131 adjacent to the second ridge 6132. The first pattern 610 may include inclined surfaces 614 extending from the plurality of valleys 6121 and 6122 to the adjacent ridges 6131 and 6132.

In the illustrated embodiment, the ridges 613 of the first pattern 610 may be edges that the first inclined surfaces 614 and the second inclined surfaces 614 substantially meet to form.

Figure 12B:
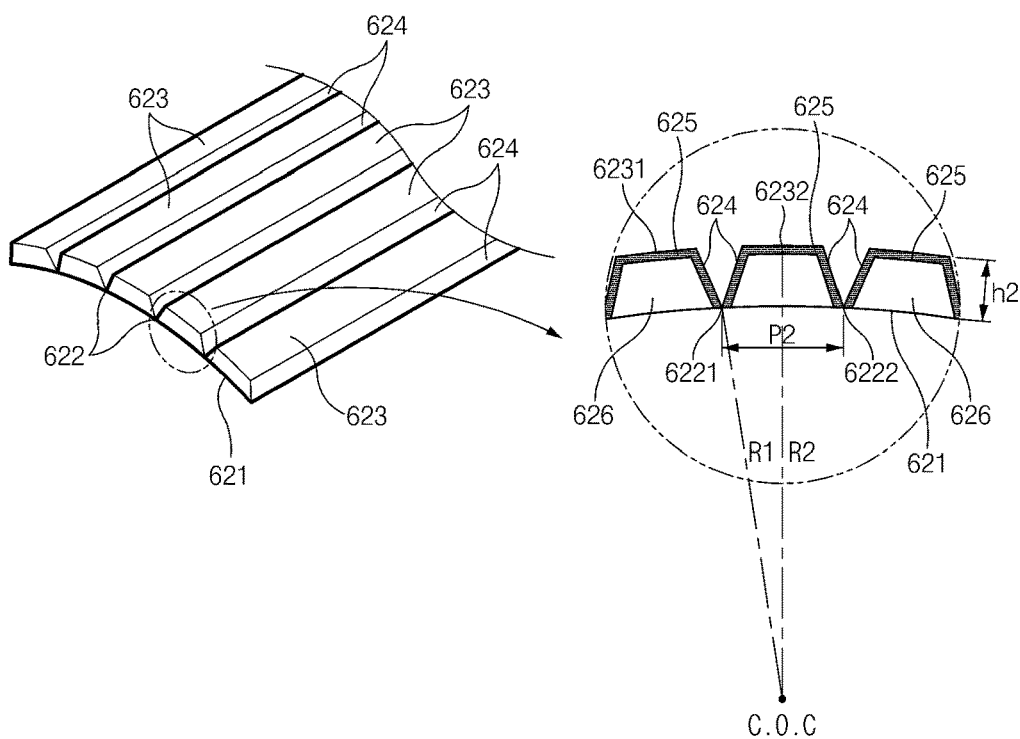

Referring to FIG. 12B, the second pattern 620 may include valleys 6221 and 6222 spaced apart from the center of curvature (C.O.C) by the first distance R1 and ridges 623 spaced by the second distance R2. The second pattern 620 may have a second height h2 corresponding to the difference between the first distance R1 and the second distance R2. The two adjacent valleys 6221 and 6222 may form a second pitch P2. In various embodiments, the second height h2 may range from 0.03 mm to 0.15 mm.

The second pattern 620 may include the first valley 6221 and the second valley 6222 adjacent to the first valley 6221. The second pattern 620 may include a second ridge 6232 formed between the first valley 6221 and the second valley 6222 and a first ridge 6231 adjacent to the second ridge 6232. The second pattern 620 may include inclined surfaces 624 extending from the plurality of valleys 6221 and 6222 to the adjacent ridges 6231 and 6232.

In the illustrated embodiment, the ridges 623 of the second pattern 620 may be formed to be flat surfaces that substantially face a radially outward direction from the center of curvature (C.O.C).

Referring to FIGS. 12A and 12B, the patterns 610 and 620 may further include metal bodies 616 and 626 (e.g., a side member and a pattern) formed of a metallic material and films 615 and 625 formed on surfaces of the metal bodies 616 and 626 to prevent corrosion of the metal bodies 616 and 626. The films 615 and 625 may contain a compound including metal atoms contained in the metal bodies 616 and 626 (e.g., a side member and a pattern). For example, the side member and the patterns formed on the side member may contain aluminum, and the films 615 and 625 may contain aluminum oxide.

In various embodiments, the films 615 and 625 may preferably be brought into contact with the metal bodies 616 and 626 over a wide area. When the films 615 and 625 are brought into contact with the metal bodies 616 and 626 over a wide area, a sufficient adhesive force may be provided between the metal bodies 616 and 626 and the films 615 and 625. When a sufficient adhesive force is not provided between the films 615 and 625 and the metal bodies 616 and 626, the films 615 and 625 may be partly removed (e.g., delaminated) from the metal bodies 616 and 626, and corrosion of the metal bodies 616 and 626 (e.g., side members) may start from the removed portions. The side member may affect the appearance of the electronic device in that the side member forms the exterior (e.g., the third surface or the side surface) of the electronic device. In particular, when the patterns 610 and 620 are formed on the side member, the films 615 and 625 formed on protruding portions (e.g., the ridges 613 and 623) of the patterns 610 and 620 may be easily removed.

From this point of view, unlike the first pattern 610, the second pattern 620 illustrated in FIG. 12B may be formed to be a flat surface so as to provide a wide contact area with the film 625. Furthermore, the ridge surfaces may form an obtuse angle with the inclined surfaces 624, and thus the film 625 may be stably formed on the metal body 626.

When the electronic device is grasped by a user, the side surface of the electronic device may be mainly brought into contact with the user's hand. A pattern that forms a portion of the side surface of the electronic device may scratch the user's hand depending on shapes.

Because the ridges 623 forming the side surface of the electronic device are formed to be flat surfaces, the pattern 620 according to the embodiment illustrated in FIG. 12B may prevent a scratch on the user's fingernail or damage to cloth, compared to the first pattern 610 according to the embodiment illustrated in FIG. 12A.

The first pattern 610 according to the embodiment illustrated in FIG. 12A may have the first height H1 and the first pitch P1. When the first height H1 is small and/or the first pitch P1 is small (e.g., a fine pattern), the first pattern 610 may prevent a scratch on the user's fingernail or damage to cloth.

Figure 13A:
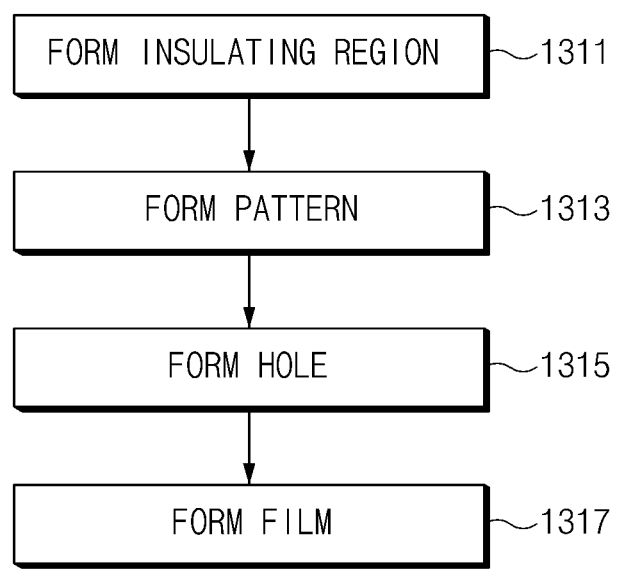
FIG. 13A is a flowchart illustrating part of a method for manufacturing a housing of the electronic device according to an embodiment.
Figure 13B:
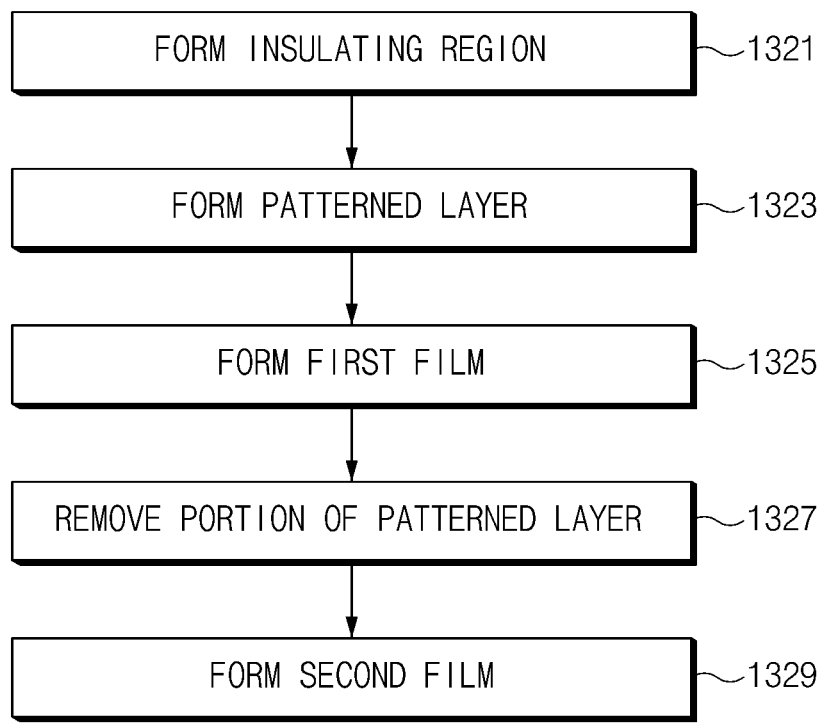
FIG. 13B is a flowchart illustrating part of a method for manufacturing a housing of the electronic device according to an embodiment.

FIG. 13A is a flowchart illustrating part of a method for manufacturing the housing (e.g., the side member) of the electronic according to an embodiment. FIG. 13B is a flowchart illustrating part of a method for manufacturing the housing (e.g., the side member) of the electronic according to an embodiment.

Referring to FIG. 13A, in the manufacturing method, an insulating region may be formed on a surface of a workpiece (1311), and a pattern may be formed on the surface of the workpiece on which the insulating region is formed (1313). Thereafter, an opening may be formed in the surface of the workpiece (1315), and a film may be formed on the surface of the workpiece (1317).

In process 1311, the insulating region may be formed by attaching an insulating material to the workpiece formed of a metallic material. For example, the metallic material may include aluminum, and the insulating material may include a polymer material. For example, an insulating portion may be injection-molded on the workpiece containing aluminum by injection of the polymer material. Thereafter, the insulating region of the insulating portion that forms the surface of the workpiece may be formed.

In process 1313, the pattern may be formed on the surface of the workpiece on which the insulating region is formed. The pattern may be formed by a CNC process including a cutting tool for cutting a portion of the surface of the workpiece. The cutting tool may vary depending on the shape of the pattern. The CNC process may be configured such that the cutting tool continuously cuts the metal portion forming the surface of the workpiece and the insulating portion (e.g., the insulating region).

In process 1315, the opening may be formed in a portion of the surface of the workpiece. The opening may be formed in the region where the pattern is formed or in the region where the pattern is not formed.

In another embodiment, process 1313 may be performed after process 1315 is performed. For example, the pattern may be formed (1313) after the opening is formed in a portion of the surface of the workpiece on which the insulating region is formed (1315). The pattern may extend across the insulating region and the opening.

In process 1317, the housing may be manufactured by forming the film on the surface of the workpiece. The film may contain a compound including metal atoms contained in the workpiece. That is, the film is not formed on the insulating region that does not include the metal atoms.

Referring to FIG. 13B, in the manufacturing method, an insulating region may be formed on a surface of a workpiece (1321), and a patterned layer may be formed on the surface of the workpiece on which the insulating region is formed (1323). Next, a first film may be formed on the surface of the workpiece (1325). Thereafter, a portion of the patterned layer may be removed (1327), and a second film may be formed (1329).

In process 1321, the insulating region may be formed by attaching an insulating material to the workpiece formed of a metallic material. For example, the metallic material may include aluminum, and the insulating material may include a polymer material. For example, an insulating portion may be injection-molded on the workpiece containing aluminum by injection of the polymer material. Thereafter, the insulating region of the insulating portion that forms the surface of the workpiece may be formed.

In process 1323, the patterned layer may be formed on the surface of the workpiece on which the insulating region is formed. The patterned layer may be formed by a CNC process using a cutting tool for cutting a portion of the surface of the workpiece. The cutting tool may vary depending on the shape of the patterned layer. The CNC process may be configured such that the cutting tool continuously cuts the metal portion forming the surface of the workpiece and the insulating portion (e.g., the insulating region).

In process 1325, the first film may be formed on a surface of the patterned layer. The first film may contain a compound including metal atoms contained in the workpiece. For example, the workpiece may contain aluminum, and the first film may contain aluminum oxide. Process 1325 may further include a dye injection process for forming a color on the first film. The dye injection process may include forming pores in the surface of the first film, injecting a first dye related to a first color into the pores, and sealing the first film.

In process 1327, a portion of the patterned layer may be removed. The portion of the patterned layer may be removed by a cutting process. The removed portion may include a portion of the workpiece and a portion of the first film. For example, portions of ridges of the patterned layer and portions of ridges of the first film may be removed.

In process 1329, the second film may be formed on the surface of the patterned layer. The second film may be formed on a region of the surface of the workpiece that is exposed to the outside by removal of the first film. The second film may contain a compound including metal atoms contained in the workpiece. Process 1329 may further include a dye injection process for forming a color on the second film. The dye injection process may include forming pores in the surface of the second film, injecting a second dye related to a second color into the pores, and sealing the second film. The second dye may differ from the first dye.

In a comparative example, a patterned metal workpiece is manufactured by injecting a metallic material into a mold having a pattern formed therein, and an insulating region is injection-molded on the workpiece by injection of a polymer.

In this case, no pattern is formed on the insulating region, and therefore the continuous pattern is cut off by the insulating region. Furthermore, in the injection molding process, injection materials may be formed around the insulating region. The injection materials may be unintentionally formed in valleys of the pattern. Moreover, an additional pattern may be formed on the insulating region through a separate process, but it is difficult to provide continuity with the original pattern. Here, the continuity of the pattern may mean, for example, a shape in which ridges and valleys are accurately connected to provide an aesthetic sense of unity to a user. Particularly, in a case of a fine pattern, the original pattern and the additional pattern may not be continuously connected. According to the comparative example, it may be difficult to implement an aesthetic sense generated from a continuous pattern.

According to the embodiment of the disclosure, the pattern may be formed on the workpiece including the insulating region. Accordingly, the pattern having a continuous shape may be provided, and thus an aesthetic sense may be provided to a user.

Figure 14A:
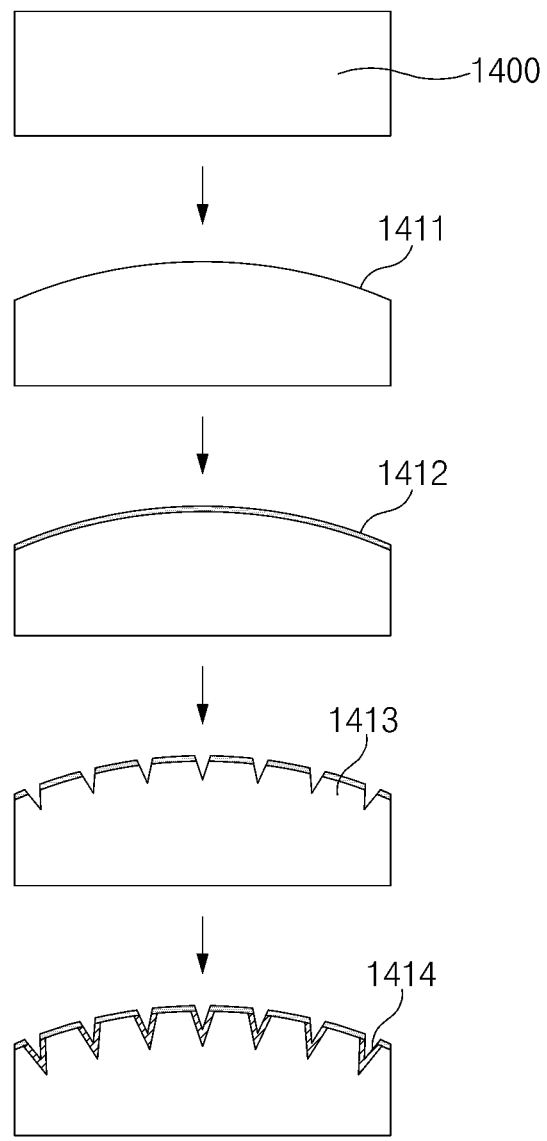
FIG. 14A is a view illustrating a method for forming a patterned region of the electronic device according to various embodiments.
Figure 14B:
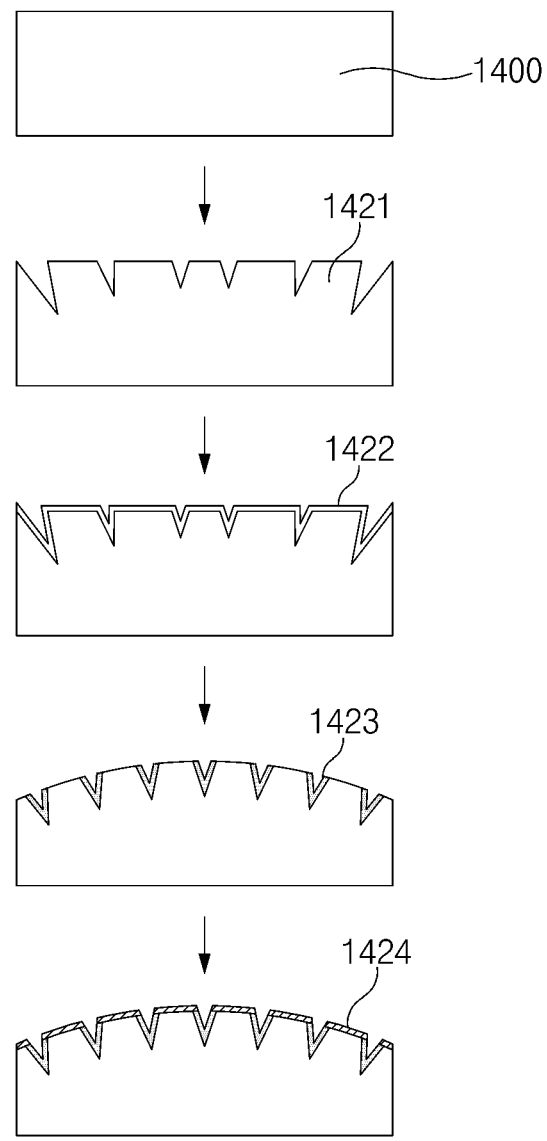
FIG. 14B is a view illustrating a method for forming a patterned region of the electronic device according to various embodiments.
Figure 14C:
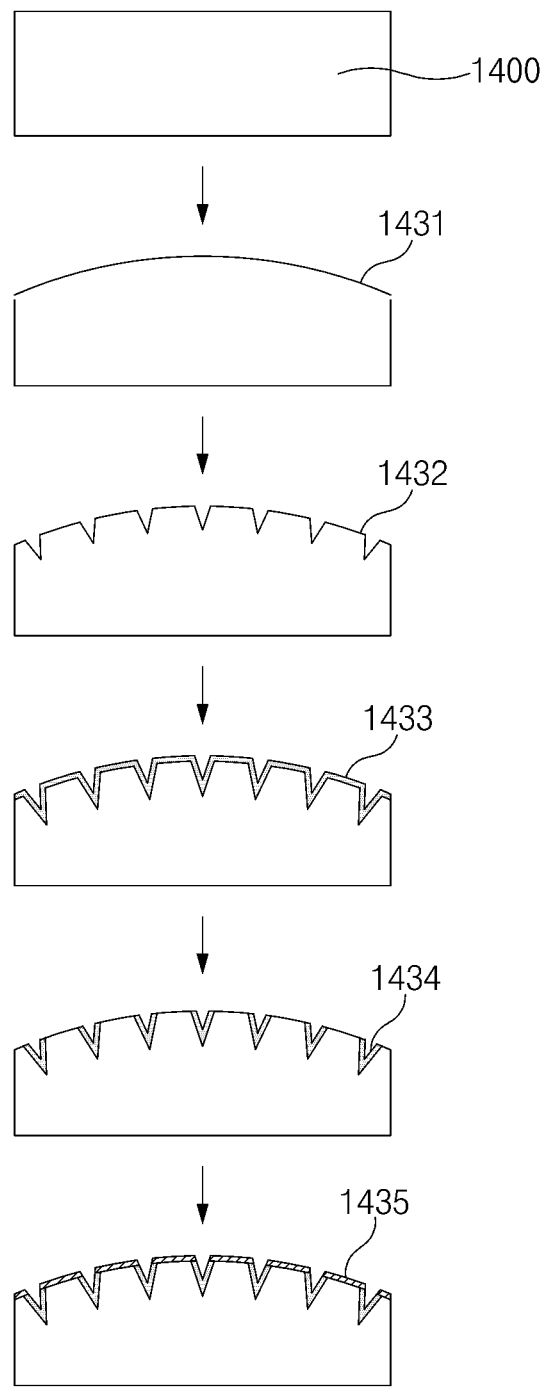
FIG. 14C is a view illustrating a method for forming a patterned region of the electronic device according to various embodiments.

FIG. 14A is a view illustrating a method for forming a patterned region of the electronic device according to various embodiments. FIG. 14B is a view illustrating a method for forming a patterned region of the electronic device according to various embodiments. FIG. 14C is a view illustrating a method for forming a patterned region of the electronic device according to various embodiments.

For example, FIG. 14 is a view illustrating various methods of 1313 illustrated in FIG. 13.

Here, the patterned regions may include the patterned region 141 including the pattern 200 illustrated in FIGS. 5 to 7 or the patterned regions 321 and 341 including the pattern 400 illustrated in FIGS. 8 to 10.

Referring to FIG. 14A, one surface of a metal body 1400 may be formed to be a curved surface 1411. The process may be performed by mechanical machining including CNC. The curved surface 1411 may form an outer surface (e.g., a side surface) of the electronic device.

A first film 1412 may be formed on the machined curved surface 1411 by an anodizing process (e.g., 1315 of FIG. 13). The first film 1412 may contain a compound (e.g., aluminum oxide) including metal atoms (e.g., aluminum) contained in the metal body 1400.

A pattern may be formed on the surface of the metal body 1400 on which the first film 1412 is formed. At this time, the first film 1412 may be removed from the region where the pattern 1413 is formed. The first film 1412 may be maintained on ridges of the pattern 1413. However, the first film 1412 may not be formed in valleys.

Accordingly, to prevent corrosion of the metal body 1400, a second film 1414 may be formed on the surface of the metal body 1400, on which the pattern 1413 is formed, through an additional anodizing process. The second film 1414 may not be formed on the region covered by the first film 1412 and may be formed on only the region where the metal body 1400 is exposed.

Referring to FIG. 14B, a pattern 1421 may be formed on one surface of a metal body 1400. The pattern 1421 may form an outer surface of the electronic device. The pattern 1421 may have different heights depending on the shape of the outer surface of the electronic device. For example, when the outer surface of the electronic device is a curved surface, a pattern formed on a central portion of the metal body 1400 and a pattern formed on a peripheral portion thereof may have different heights as illustrated in the drawing.

A first film 1422 may be formed on the surface of the metal body 1400 on which the pattern 1422 is formed (e.g., 1315 of FIG. 13). The first film 1422 may contain a compound (e.g., aluminum oxide) including metal atoms (e.g., aluminum) contained in the metal body 1400.

The surface of the metal body 1400 on which the first film 1422 is formed may be machined into a curved surface 1421. At this time, the region of the first film 1422 that forms ridges of the pattern 1422 may be removed, and the region of the first film 1422 that forms valleys of the pattern 1422 may be maintained.

Accordingly, to prevent corrosion of the metal body 1400, a second film 1424 may be formed on the surface of the metal body 1400, on which the pattern 1423 is formed, through an additional anodizing process. The second film 1424 may not be formed on the region covered by the first film 1423 and may be formed on only the region where the metal body 1400 is exposed.

Referring to FIG. 14C, a surface of a metal body 1400 may be machined into a curved surface 1431. A pattern 1432 may be formed on the machined curved surface 1431 of the metal body 1400. The pattern 1432 may form an outer surface of the electronic device. The pattern 1432 may have different heights depending on the shape of the outer surface of the electronic device. For example, when the outer surface of the electronic device is a curved surface, a pattern formed on a central portion of the metal body 1400 and a pattern formed on a peripheral portion thereof may have different heights as illustrated in the drawing. In various embodiments, the process of forming the curved surface 1431 and the process of forming the pattern 1432 may be simultaneously performed.

A first film 1433 may be formed on the surface of the metal body 1400 on which the pattern 1432 is formed (e.g., 1315 of FIG. 13). The first film 1433 may contain a compound (e.g., aluminum oxide) including metal atoms (e.g., aluminum) contained in the metal body 1400. The first film 1433 may be formed cover both ridges and valleys of the pattern 1432.

The surface of the metal body 1400 on which the first film 1433 is formed may be formed to be a curved surface by cutting. At this time, the cutting may be performed to remove at least the first film 1433 formed on the rides. Accordingly, the first film 1433 may be formed in only the valleys 1434 of the pattern. At this time, part of the metal body 1400, together with the first film 1433, may be cut in the cutting process. A second film 1435 may be formed on the region (e.g., the ridges) where the first film 1433 is not formed on the surface of the metal body 1400. The second film 1435 may not be formed on the region (e.g., the valleys 1434) covered by the first film 1433 and may be formed on only the region (e.g., the ridges) where the metal body 1400 is exposed. Accordingly, the second film 1435 may be formed on the ridges, and the first film 1433 may be formed on the remaining portion.

In the illustrated embodiments, the first film 1414, 1422, or 1433 and the second film 1414, 1424, or 1435 may be formed on the surface of the metal body 1400 by the plurality of anodizing processes. At this time, the second film 1414, 1424, or 1435 may not be formed on the region where the first film 1412, 1422, or 1433 is formed. Accordingly, a film having a substantially uniform thickness may be formed on the surface of the metal body 1400.

Figure 15:
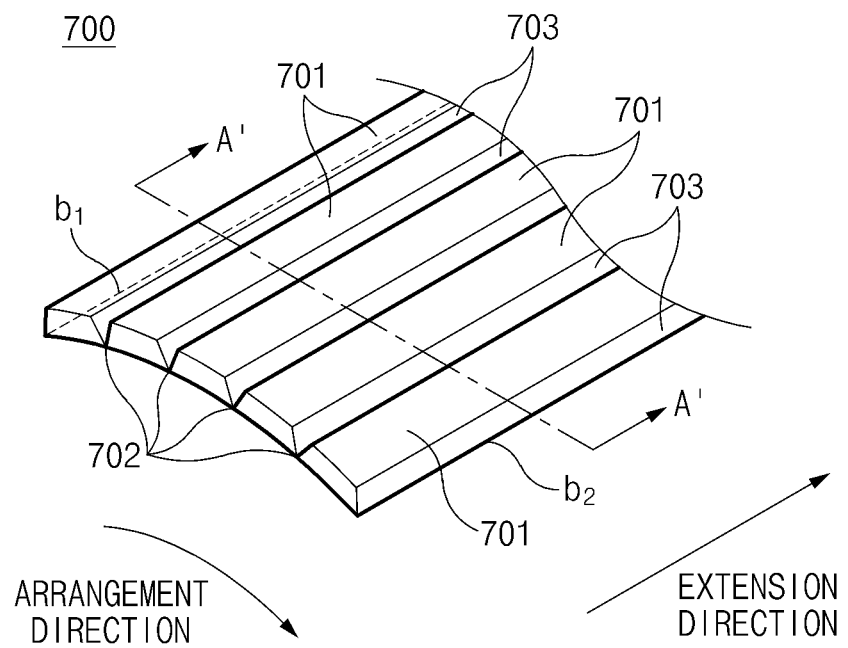
FIG. 15 is a view illustrating a patterned region of the electronic device according to various embodiments.

FIG. 15 is a view illustrating a patterned region of the electronic device according to various embodiments.

In various embodiments, the electronic device 300 may include a housing and a patterned region 700 formed on at least part of a surface of the housing.

In the illustrated embodiment, the patterned region 700 (e.g., the patterned regions 321 and 341 of FIG. 9) may include a first edge b1, a second edge b2, and a plurality of unit patterns formed between the first edge b1 and the second edge b2. The first edge b1 may refer to an edge between the patterned region 700 (e.g., the patterned regions 321 and 341 of FIG. 9) and a region (e.g., the first regions 3221 and 342 of FIG. 9) where no pattern is formed. The second edge b2 may refer to an edge between the patterned region 700 (e.g., the patterned regions 321 and 341 of FIG. 9) and a region (e.g., the second regions 323 and 343 of FIG. 9) where no pattern is formed.

In the illustrated embodiment, the patterned region 700 may include ridges 701, valleys 702 located closer to the interior space of the housing than the ridges 701, and inclined surfaces 703 connecting the valleys 702 and the ridges 701. The ridges 701 may include portions that protrude outside the housing with respect to the valleys 702. Each of the valleys 702 may be formed between any one inclined surface 703 and another inclined surface 703 adjacent thereto, or may be formed to be an edge that any one inclined surface 703 and another inclined surface 703 adjacent thereto cross each other to form.

In the illustrated embodiment, the ridges 701 may be formed to be surfaces having areas. The valleys 702 may be formed to be lines having lengths, but are not necessarily limited thereto. For example, likewise to the ridges 701, the valleys 702 may be formed to be surfaces having areas. For example, the ridges 701 may be formed to be lines, or the valleys 702 may be formed to be surfaces.

In the illustrated embodiment, the patterned region 700 may include the plurality of unit patterns arranged along the surface of the housing. The plurality of unit patterns may be formed between the first edge b1 and the second edge b2. Each of the first edge b1 and the second edge b2 may be any one valley 702 included in a unit pattern.

In the illustrated embodiment, the patterned region 700 may include the plurality of unit patterns. One unit pattern may include one ridge 701, two valleys 702 located on opposite sides of the ridge 701, and inclined surfaces 703 connecting the valleys 702 and the ridge 701.

In the illustrated embodiment, the plurality of unit patterns may extend parallel to one another. Hereinafter, the direction in which the plurality of unit patterns extend will be referred to as the "pattern extension direction". The plurality of unit patterns may be arranged between the first edge and the second edge of the patterned region in a predetermined direction. Hereinafter, the direction in which the plurality of unit patterns are arranged will be referred to as the "pattern arrangement direction". Each of the unit patterns may include two valleys. Hereinafter, the gap between the two valleys will be referred to as the "pitch". The "pitch" may be a distance measured in a straight line or measured along the surface of the housing.

In various embodiments, the patterned region 700 may be formed to be a curved surface, but is not necessarily limited thereto. For example, the patterned region 700 may be formed to be a flat surface.

FIG. 16 is a sectional view illustrating a patterned region of the electronic device according to various embodiments. FIG. 16 is a sectional view taken along line A-A' illustrated in FIG. 15.

Referring to FIG. 16, the patterned region 700 is illustrated as including unit patterns formed on a flat surface, but is not limited thereto. For example, the patterned region 700 may include unit patterns formed on a curved surface. FIG. 16 is an enlarged view of a micro-scale fine pattern, and it may be understood that the fine pattern is approximated to a flat surface although formed on a curved surface.

In the illustrated embodiment, the patterned region 700 may include a plurality of unit patterns 700a, 700b, and 700c. The unit patterns 700a, 700b, and 700c may include the first pattern 700a, the second pattern 700b, and the third pattern 700c. The first pattern 700a, the second pattern 700b, and the third pattern 700c may be formed in sequence along a pattern arrangement direction. That is, the first pattern 700a may be adjacent to the second pattern 700b, and the third pattern 700c may be adjacent to the second pattern 700b. The second pattern 700b may be formed between the first pattern 700a and the third pattern 700c.

In the illustrated embodiment, the first pattern 700a may include a first ridge 721, a first valley 711 and a second valley 712 formed on opposite sides of the first ridge 721, and first inclined surfaces 731 connecting the first ridge 721 with the first valley 711 and the second valley 712.

In the illustrated embodiment, the second pattern 700b may include a second ridge 722, a third valley 713 and a fourth valley 714 formed on opposite sides of the second ridge 722, and second inclined surfaces 732 connecting the second ridge 722 with the third valley 713 and the fourth valley 714.

In the illustrated embodiment, the third pattern 700c may include a third ridge 723, a fifth valley 715 and a sixth valley 716 formed on opposite sides of the third ridge 723, and third inclined surfaces 733 connecting the third ridge 723 with the fifth valley 715 and the sixth valley 716.

In the illustrated embodiment, the second valley 712 included in the first pattern 700a and the third valley 713 included in the second pattern 700b may form one edge. The one edge may be an edge that the first inclined surface 731 and the second inclined surface 732 cross each other to form. The first inclined surface 731 and the second inclined surface 732 may extend at a predetermined angle with the one edge as the center. The first inclined surface 731 and the second inclined surface 732 may form a predetermined angle θ1.

In various embodiments, the first inclined surfaces 731 may extend from the first valley 711 and the second valley 712 to the first ridge 721 at a predetermined angle. The second inclined surfaces 732 may extend from the third valley 713 and the fourth valley 714 to the second ridge 722 at a predetermined angle. The first inclined surface 731 and the second inclined surface 732 may form the predetermined angle θ1.

In the illustrated embodiment, the fourth valley 714 included in the second pattern 700b and the fifth valley 715 included in the third pattern 700c may form one edge. The one edge may be an edge that the second inclined surface 732 and the third inclined surface 733 cross each other to form. The second inclined surface 732 and the third inclined surface 733 may extend at a predetermined angle with the one edge as the center. The second inclined surface 732 and the third inclined surface 733 may form a predetermined angle θ2.

In various embodiments, the second inclined surfaces 732 may extend from the third valley 713 and the fourth valley 714 to the second ridge 722 at a predetermined angle. The third inclined surfaces 733 may extend from the fifth valley 715 and the sixth valley 716 to the third ridge 723 at a predetermined angle. The second inclined surface 732 and the third inclined surface 733 may form the predetermined angle θ2.

Figure 16A:
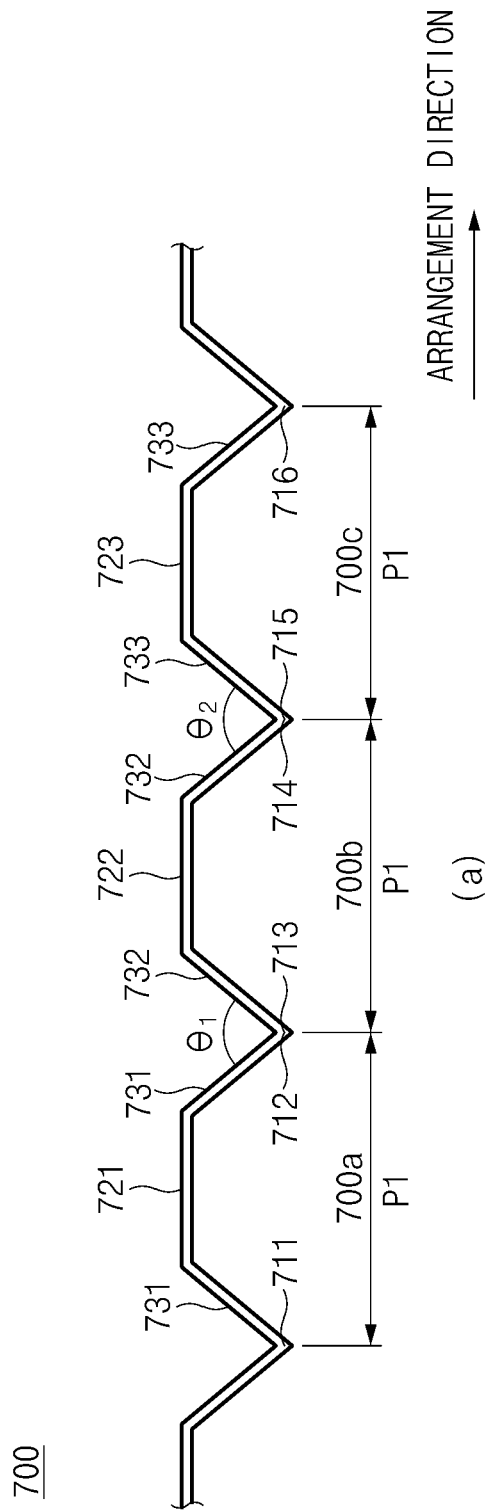
FIG. 16 is a sectional view illustrating a patterned region of the electronic device according to various embodiments.

Referring to FIG. 16A, the first pattern 700a, the second pattern 700b, and the third pattern 700c may have the same pitch P. Specifically, the first valley 711 and the second valley 712 may be spaced apart from each other by a first pitch P, the third valley 713 and the fourth valley 714 may be spaced apart from each other by the first pitch P, and the fifth valley 715 and the sixth valley 716 may be spaced apart from each other by the first pitch P.

In various embodiments, the first pitch P may range from 0.10 mm to 0.60 mm.

Figure 16B:
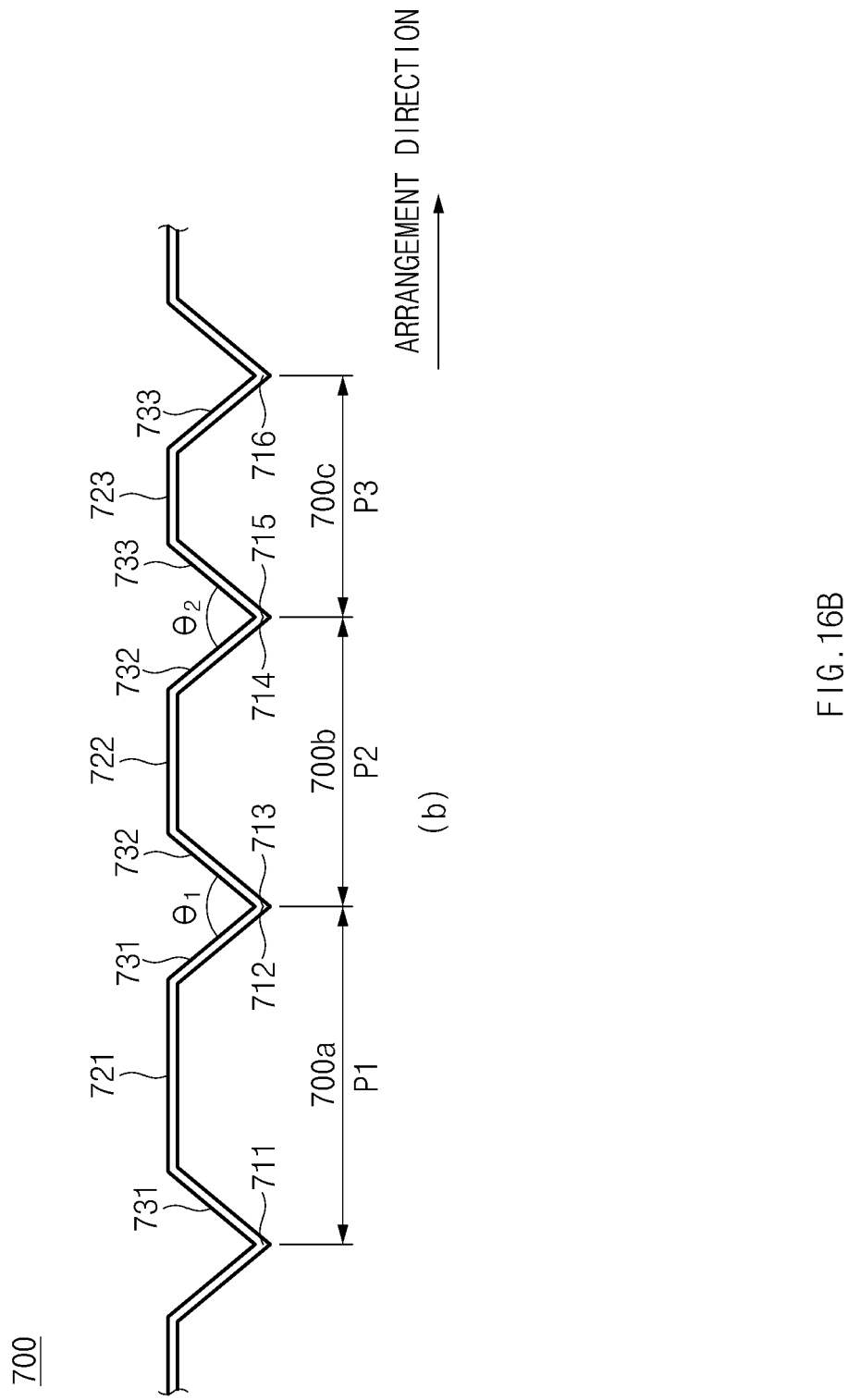

Referring to FIG. 16B, the first pattern 700a, the second pattern 700b, and the third pattern 700c may have different pitches P1, P2, and P3. Specifically, the first valley 711 and the second valley 712 may be spaced apart from each other by the first pitch P1. The third valley 713 and the fourth valley 714 may be spaced apart from each other by the second pitch P2 different from the first pitch P1. The fifth valley 715 and the sixth valley 716 may be spaced apart from each other by the third pitch P3 different from the first pitch P1 and the second pitch P2.

Referring to FIG. 16B, the first pattern 700a, the second pattern 700b, and the third pattern 700c may be formed in sequence in the pattern arrangement direction. The patterns 700a, 700b, and 700c, when viewed in the pattern arrangement direction, may be formed to have gradually decreasing pitches or gradually increasing pitches. That is, the first pitch P1, the second pitch P2, and the third pitch P3 may be gradually decreased or increased when viewed in the pattern arrangement direction.

In various embodiments, the first pitch P1 may range from 0.10 mm to 0.60 mm, the second pitch P2 may range from 0.10 mm to 0.40 mm, and the third pitch P3 may range from 0.10 mm to 0.30 mm.

In various embodiments, the unit patterns 700a, 700b, and 700c may have gradually decreasing or increasing pitches from the first edge toward the second edge.

Referring to FIG. 16B, when the angles between the inclined surfaces 731, 732, and 733 are constant (θ1=θ2), the first ridge 721, the second ridge 722, and the third ridge 723 may have gradually decreasing or increasing areas when viewed in the pattern arrangement direction.

Figure 16C:
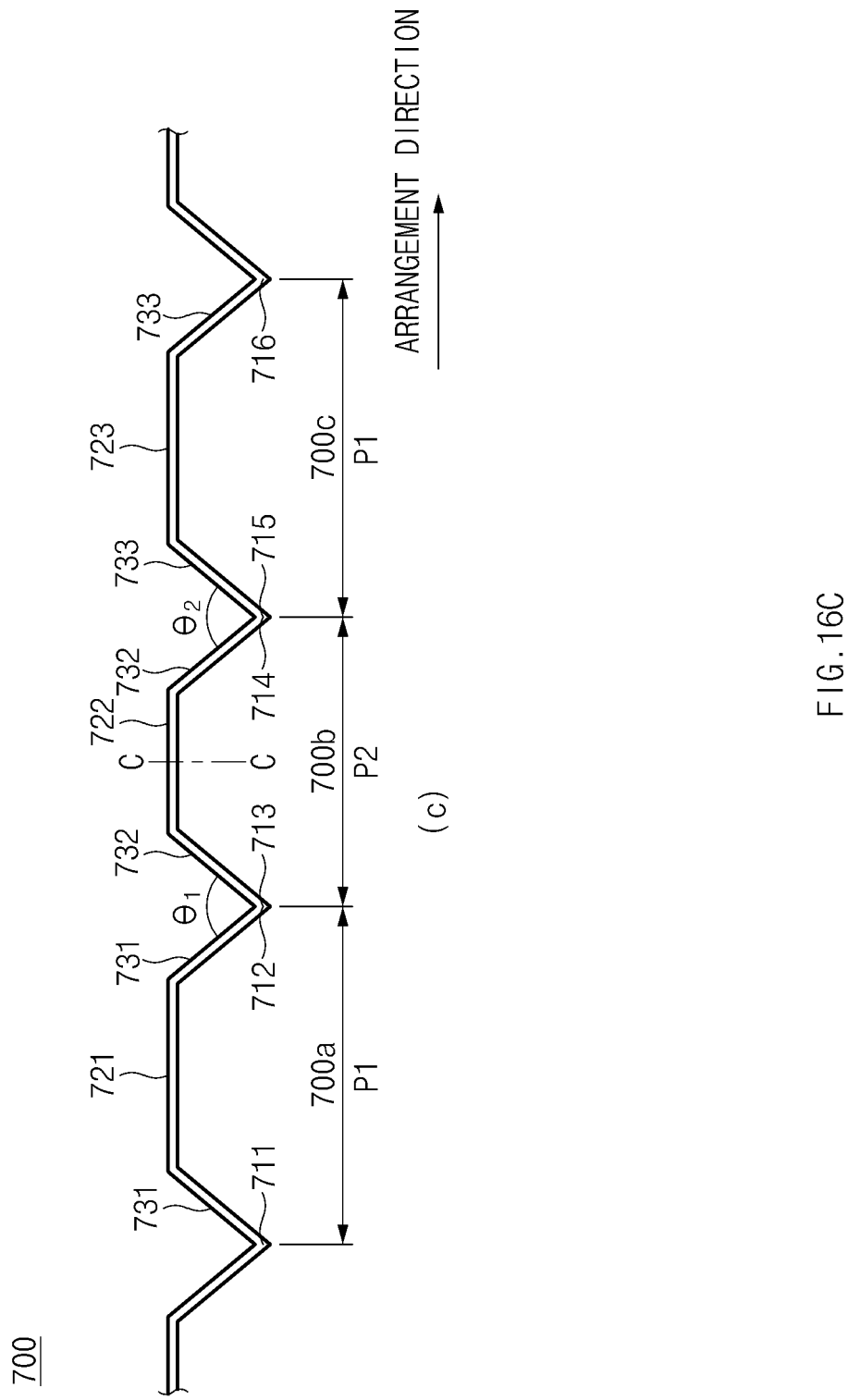

Referring to FIG. 16C, the plurality of patterns 700a, 700b, and 700c may be formed such that the first pattern 700a and the third pattern 700c are symmetric to each other with respect to the second pattern 700b. In various embodiments, the plurality of patterns 700a, 700b, and 700c may be formed such that the center line C of the patterned region 700 passes through the second ridge 722 included in the second pattern. In this case, the center line C of the patterned region 700 may include the center lines of the first edge (e.g., the first edge b1 of FIG. 15) and the second edge (e.g., the second edge b2 of FIG. 15) of the patterned region 700. The plurality of patterns 700a, 700b, and 700c may be formed to be symmetrical with respect to the center line C of the patterned region 700.

Referring to FIG. 16C, the first pattern 700a may have the first pitch P1, the second pattern 700b may have the second pitch P2 different from the first pitch P1, and the third pattern 700c may have the first pitch P1. Specifically, the first valley 711 and the second valley 712 may be spaced apart from each other by the first pitch P1, the third valley 713 and the fourth valley 714 may be spaced apart from each other by the second pitch P2 different from the first pitch P1, and the fifth valley 715 and the sixth valley 716 may be spaced apart from each other by the first pitch P1.

In various embodiments, the first pitch P1 may range from 0.10 mm to 0.60 mm, and the second pitch P2 may range from 0.10 mm to 0.40 mm.

FIG. 17 is a view illustrating a patterned region of the electronic device according to various embodiments.

In the illustrated embodiment, the patterned region 800 may include ridges 801, valleys 802 located closer to the interior space of the housing than the ridges 801, and inclined surfaces 803 connecting the valleys 802 and the ridges 801. The ridges 801 may protrude outside the housing with respect to the valleys 802. Each of the valleys 802 may be formed to be an edge that any one inclined surface 803 and another inclined surface 803 adjacent thereto cross each other to form. In various embodiments, the valley 802 may include a surface region formed between any one inclined surface 803 and another inclined surface 803.

In the illustrated embodiment, the patterned region 800 may be formed such that at least some of the ridges 801 have a first color and at least some of the inclined surfaces 803 have a second color.

Referring to FIG. 17, the patterned region 800 of the housing may be recognized by a user in various colors depending on an arrangement angle of the electronic device 300. The color recognized by the user may be a color that is a combination of the first color and the second color. The color recognized by the user may vary depending on the angle at which the user views the patterned region 800.

To describe the color recognized by the user, a predetermined plane having a normal vector substantially parallel to the user's gaze may be defined. Orthogonal projections of the ridges 801 and the inclined surfaces 803 may be formed on the predetermined plane.

In various embodiments, the color recognized by the user may vary depending on the areas of the orthogonal projections of the ridges 801 and the inclined surfaces 803. Here, the areas of the orthogonal projections of the inclined surfaces 803 with respect to the areas of the orthogonal projections of the ridges 801 may be defined as a ratio (=orthogonal projection areas of inclined surfaces/orthogonal projection areas of ridges). As the ratio is increased, the user may recognize the color of the patterned region 800 as a color closer to the second color (the color of the inclined surfaces).

Figure 17A:
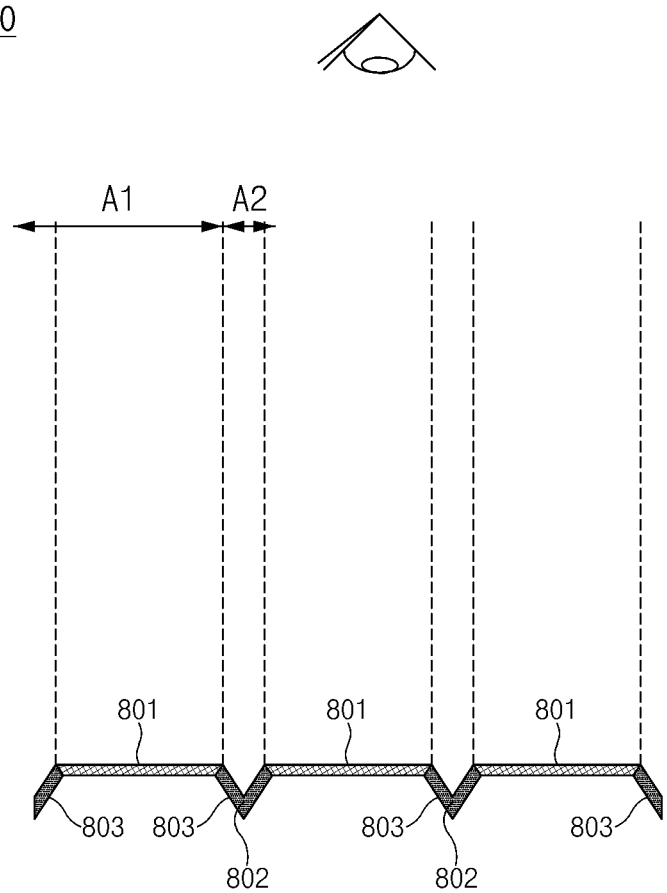
FIG. 17 is a view illustrating a patterned region of the electronic device according to various embodiments.

For example, referring to FIG. 17A, when the patterned region 800 is viewed in the vertical direction, for example, when the predetermined plane and the patterned region 800 are parallel to each other, the color recognized by the user may be a color in which the first color and the second color are combined at a predetermined first ratio (A2/A1).

Figure 17B:
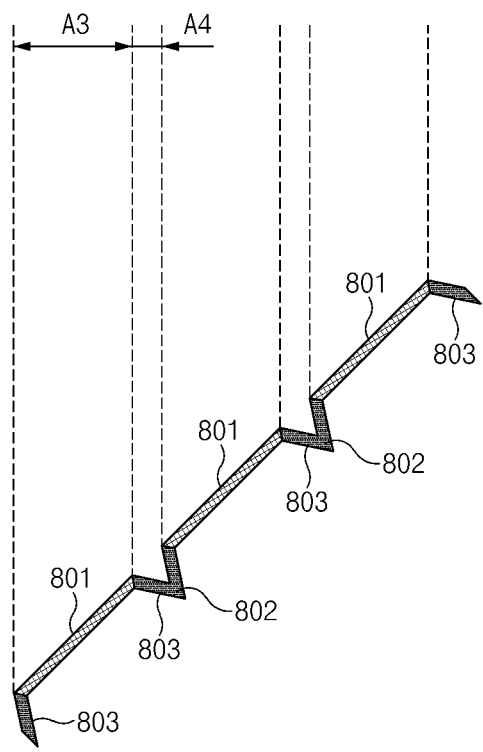

For example, referring to FIG. 17B, when the patterned region 800 is viewed at a predetermined angle, the color recognized by the user may be a color in which the first color and the second color are combined at a predetermined second ratio (A4/A3).

In this case, the user may recognize the color of the patterned region 800 as a color closer to the second color than in the case of FIG. 17A, because the second ratio (A4/A3) of FIG. 17B is greater than the first ratio (A2/A1) of FIG. 17A.

Figure 17C:
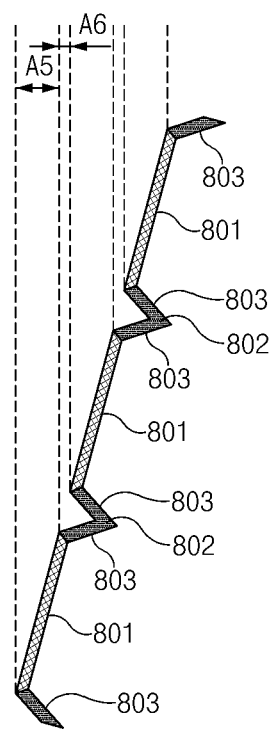

For example, referring to FIG. 17C, when the patterned region 800 is viewed at a predetermined angle, the color recognized by the user may be a color in which the first color and the second color are combined at a predetermined second ratio (A6/A5).

In this case, the user may recognize the color of the patterned region 800 as a color closer to the second color than in the case of FIGS. 17A and 17B, because the third ratio (A6/A5) of FIG. 17C is greater than the first ratio (A2/A1) and the second ratio (A4/A3).

As described above, the patterned region 800 of the disclosure may provide impressions of various colors to the user depending on the arrangement angle of the electronic device 300.

In various embodiments, the first color and the second color may be complementary colors. The patterned region 800 may provide a relatively clear impression of color to the user through complementary contrast of the ridges 801 and the inclined surfaces 803.

Hereinafter, a method for manufacturing the patterned regions 700 and 800 will be described with reference to FIGS. 14A, 14B, and 14C.

The first color of the patterned regions 700 and 800 may be formed by one of the first film 1412, 1422, or 1433 or the second film 1414, 1424, or 1435, and the second color may be formed by the other. The patterned regions 700 and 800 may be formed by at least two anodizing processes so as to have two or more colors.

A cutting process of cutting a partial area of a pattern may be performed between the two anodizing processes. A portion of the first film 1412, 1422, or 1433 may be cut by the cutting process. The second film 1414, 1424, or 1435 may be formed on the cut portion by the second anodizing process.

For example, referring to FIG. 14A, the first film 1412 on the inclined surfaces and the valleys may be cut, and the second film 1414 may be formed on the inclined surfaces and the valleys. For example, referring to FIGS. 14B and 14C, the first films 1422 and 1433 on the ridges may be cut, and the second films 1424 and 1435 may be formed on the ridges. Referring to FIG. 13B together, in processes 1325 and 1329 of forming the first film 1412, 1422, or 1433 and the second film, the first film 1412, 1422, or 1433 and the second film 1414, 1424, or 1435 may be formed to have different colors.

For example, the first films 1412, 1422, and 1433 may further include a first dye related to the first color. The first films 1412, 1422, and 1433 may have a plurality of pores formed in the surfaces thereof. The first dye related to the first color may be received in the pores.

For example, the second films 1414, 1424, and 1435 may further include a second dye related to the second color. The second films 1414, 1424, and 1435 may have a plurality of pores formed in the surfaces thereof. The second dye related to the second color different from the first color may be received in the pores.

An electronic device 300 according to the embodiments of the disclosure may include a housing and a patterned region 700 formed on at least part of a surface of the housing. The patterned region 700 may include a first edge b1, a second edge b2, and a first pattern 700*a* formed between the first edge b1 and the second edge b2. The first pattern 700*a* may include a first ridge 721, a first valley 711 and a second valley 712 located closer to an interior space of the housing than the first ridge 721, and first inclined surfaces 731 extending from the first ridge 721 to the first valley 711 and the second valley 712. The first ridge 721 may be formed in a first color, and the first inclined surfaces 731 may be formed in a second color.

In various embodiments, the first pattern 700*a* may be formed such that the first valley 711 and the second valley 712 are spaced apart from each other by a first pitch P1, and the first pitch may range from 0.10 mm to 0.60 mm.

In various embodiments, the patterned region 700 may further include a second pattern 700*b* formed between the first edge b1 and the second edge b2 and adjacent to the first pattern 700*a* in one direction. The second pattern 700*b* may include a second ridge 722, a third valley 713 and a fourth valley 714 located closer to the interior space of the housing than the second ridge 722, and second inclined surfaces 732 extending from the second ridge 722 to the third valley 713 and the fourth valley 714. The first pattern 700*a* may be formed such that the first valley 711 and the second valley 712 are spaced apart from each other by a first pitch P1. The second pattern 700*b* may be formed such that the third valley 713 and the fourth valley 714 are spaced apart from each other by a second pitch P2 different from the first pitch P1.

In various embodiments, the second valley 712 and the third valley 713 may include an edge that the first inclined surface 731 and the second inclined surface 732 substantially cross each other to form.

In various embodiments, the first inclined surface 731 and the second inclined surface 732 may form a predetermined angle with the edge as the center, and the predetermined angle θ1 or θ2 may range from 60 degrees to 100 degrees.

In various embodiments, the patterned region 700 may further include a third pattern 700c formed between the first edge b1 and the second edge be and adjacent to the second pattern 700b in the one direction. The third pattern 700c may include a third ridge 723, a fifth valley 715 and a sixth valley 716 located closer to the interior space of the housing than the third ridge 723, and third inclined surfaces 733 extending from the third ridge 723 to the fifth valley 715 and the sixth valley 716. The third pattern 700c may be formed such that the fifth valley 715 and the sixth valley 716 are spaced apart from each other by a third pitch P1.

In various embodiments, the first pitch P1 and the third pitch P1 may be the same as each other, and the second pitch P2 may be smaller or greater than the first pitch P1 and the third pitch P1.

In various embodiments, the patterned region 700 may include a center line C formed in a position spaced apart from the first edge b1 and the second edge b2 at the same interval. The center line C may pass through the second ridge 722 of the second pattern 700b, and the first pattern 700a and the third pattern 700c may be symmetric to each other with respect to the center line C.

In various embodiments, the first pitch P1 may be greater than the second pitch P2 and the third pitch P3, and the second pitch P2 may be greater than the third pitch P3.

In various embodiments, the first color and the second color may be complementary colors.

In various embodiments, the first pitch P1 may range from 0.10 mm to 0.60 mm, the second pitch P2 may range from 0.10 mm to 0.40 mm, and the third pitch P3 may range from 0.10 mm to 0.30 mm.

According to various embodiments, an electronic device may include a housing 110 including a first surface 110A, a second surface 110B that faces away from the first surface 110A, and a third surface 110C that surrounds a space between the first surface 110A and the second surface 110B, and a display disposed in the space of the housing 110 so as to be visible through the first surface 110A. The third surface 110C may include a first region (e.g., the patterned region 141) including a pattern 200 formed on a surface thereof, a second region (e.g., the first region 142) formed between the first region (e.g., the patterned region 141) and the first surface 110A, and a third region (e.g., the second region 143) formed between the first region (e.g., the patterned region 141) and the second surface 110B. The first region (e.g., the patterned region 141) may include a curved surface having the center of curvature located in a direction toward the space of the housing 110 with respect to the third surface 110C.

According to various embodiments, the third surface 110C may include a first metal region 1441 and a second metal region 1442 formed of a metallic material and an insulating region 145 formed of an insulating material and formed between the first metal region 1441 and the second metal region 1442 to insulate the first metal region 1441 and the second metal region 1442. The pattern 200 may be continuously formed from the first region (e.g., the patterned region 141) included in the first metal region 1441 or the second metal region 1442 to the first region (e.g., the patterned region 141) included in the insulating region 145.

According to various embodiments, the pattern 200 may be continuously formed from the first region (e.g., the patterned region 141) included in the first metal region 1441 to the second region (e.g., the first region 142) included in the second metal region 1442 across the first region (e.g., the patterned region 141) included in the insulating region 145.

According to various embodiments, the insulating region 145 may include a first insulating region 1451 formed on one side of the first metal region 1441 and a second insulating region 1452 formed on an opposite side of the first metal region 1441.

According to various embodiments, the first region (e.g., the patterned region 141) may be connected with the second region (e.g., the first region 142) to form a first angle (e.g., θ1 of FIG. 11) with the second region (e.g., the first region 142), and the first region (e.g., the patterned region 141) may be connected with the third region (e.g., the second region 143) to form a second angle (e.g., θ2 of FIG. 11) with the third region (e.g., the second region 143).

According to various embodiments, the first angle (e.g., θ1 of FIG. 11) and the second angle (e.g., θ2 of FIG. 11) may be substantially the same as each other.

According to various embodiments, at least part of the second region (e.g., the first region 142) and/or the third region (e.g., the second region 143) may be formed to be a flat surface (e.g., region 1-1 1421 of FIG. 11 and/or region 2-1 1431 of FIG. 11).

According to various embodiments, at least part of the second region (e.g., the first region 142) and/or the third region (e.g., the second region 143) may be formed to be a curved surface having a different curvature from the first region (e.g., the patterned region 141).

According to various embodiments, the pattern 200 may include a first valley 6121 or 6221 spaced apart from the center of curvature by a first distance, a second valley 6122 or 6222 adjacent to the first valley 6121 or 6221 and spaced apart from the center of curvature by the first distance, and a ridge 613 or 623 formed between the first valley 6121 or 6221 and the second valley 6122 or 6222 and spaced apart from the center of curvature by a second distance greater than the first distance. A first inclined surface 614 or 624 may be formed between the first valley 6121 or 6221 and the ridge 613 or 623, the first inclined surface 614 or 624 being a substantially flat surface. A second inclined surface 614 or 624 may be formed between the second valley 622 and the ridge 613 or 623, the second inclined surface 614 or 624 being a substantially flat surface.

According to various embodiments, the ridge 623 may include a ridge surface formed between the first inclined surface 624 and the second inclined surface 624.

According to various embodiments, the ridge 613 may be formed to be an edge that the first inclined surface 614 and the second inclined surface 614 make contact with each other to form.

According to various embodiments, the pattern 200 may include a plurality of valleys 612 or 622 spaced apart from the center of curvature by a first distance and a plurality of ridges 613 or 623 spaced apart from the center of curvature by a second distance greater than the first distance. The pattern 200 may be formed such that a gap P1 or P2 between two adjacent valleys 6121 and 6122 or 6221 and 6222 among the plurality of valleys 612 or 622 is substantially constant.

According to various embodiments, an electronic device may include a first plate 120 that forms a first surface 110A of the electronic device, a second plate 180 that faces away from the first plate 120 and that forms a second surface 110B of the electronic device, and a side member 140 that surrounds a space between the first plate 120 and the second plate 180 and that includes an outer surface forming a third surface 110C of the electronic device. The outer surface may include a first edge 140a adjacent to the first plate 120, a second edge 140b adjacent to the second plate 180, and a pattern 200 formed between the first edge 140a and the second edge 140b. The side member 140 may include a first metal portion (e.g., the first metal region 1441) and a second metal portion (e.g., the second metal region 1442) that are formed of a metallic material and an insulating portion formed of an insulating material and formed between the first metal portion (e.g., the first metal region 1441) and the second metal portion (e.g., the second metal region 1442). The insulating portion may form an insulating region 145 extending from the first edge 140a to the second edge 140b. The pattern 200 may have a continuous shape extending from the first metal portion (e.g., the first metal region 1441) to the second metal portion (e.g., the second metal region 1442) through the insulating region 145.

According to various embodiments, the outer surface may include a patterned region 141 having the pattern 200 formed thereon, a first region 142 formed between the patterned region 141 and the first edge 140a, and a second region 143 formed between the patterned region 141 and the second edge 140b. The patterned region 141 may include a curved surface having a predetermined curvature such that the center of curvature is located in the space with respect to the outer surface.

According to various embodiments, the first region 142 and the second region 143 may be connected with the patterned region 141 at a first angle (e.g., θ1 of FIG. 11) and a second angle (e.g., θ2 of FIG. 11).

According to various embodiments, the first region 142 and the second region 143 may each include a curved surface having a curvature different from the curvature of the patterned region 141.

According to various embodiments, the first plate 120 may include a flat portion facing a first direction and a curved portion 122 formed on at least part of an edge of the flat portion, and the pattern 200 may extend in a direction perpendicular to the first direction.

According to various embodiments, the insulating region 145 may extend in a direction perpendicular to the extension direction of the pattern 200.

According to various embodiments, the second metal portion (e.g., the second metal region 1442) may include a metal portion 2-1 (e.g., the second metal portion 1442) formed on one side of the first metal portion (e.g., the first metal region 1441) and a metal portion 2-2 (e.g., the third metal portion 1443) formed on an opposite side of the first metal portion (e.g., the first metal region 1441). The first metal portion (e.g., the first metal region 1441) may be electrically insulated from the metal portion 2-1 (e.g., the second metal portion 1442) and the metal portion 2-2 (e.g., the third metal portion 1443) by the insulating portion, and the first metal portion (e.g., the first metal region 1441) may form an antenna.

According to various embodiments, the patterned region 141 may include a third edge 141a adjacent to the first region 142 and a fourth edge 141b adjacent to the second region 143. The pattern 200 may include a first sub-pattern 221 that forms a first angle with respect to a virtual central axis spaced apart from the third edge 141a and the fourth edge 141b at the same interval and a second sub-pattern 222 that forms a second angle with respect to the virtual central axis. The first angle and the second angle may be symmetric to each other with respect to the virtual central axis.

Various embodiments of the disclosure and terms used herein are not intended to limit the technologies described in the disclosure to specific embodiments, and it should be understood that the embodiments and the terms include modification, equivalent, and/or alternative on the corresponding embodiments described herein. With regard to description of drawings, similar components may be marked by similar reference numerals. The terms of a singular form may include plural forms unless otherwise specified. In the disclosure disclosed herein, the expressions "A or B", "at least one of A and/or B", "A, B, or C", or "at least one of A, B, and/or C", and the like used herein may include any and all combinations of one or more of the associated listed items. Expressions such as "first," or "second," and the like, may express their components regardless of their priority or importance and may be used to distinguish one component from another component but is not limited to these components. When an (e.g., first) component is referred to as being "(operatively or communicatively) coupled with/to" or "connected to" another (e.g., second) component, it may be directly coupled with/to or connected to the other component or an intervening component (e.g., a third component) may be present.

According to the situation, the expression "adapted to or configured to" used herein may be interchangeably used as, for example, the expression "suitable for", "having the capacity to", "changed to", "made to", "capable of" or "designed to" in hardware or software. The expression "a device configured to" may mean that the device is "capable of" operating together with another device or other parts. For example, a "processor configured to (or set to) perform A, B, and C" may mean a dedicated processor (e.g., an embedded processor) for performing corresponding operations or a generic-purpose processor (e.g., a central processing unit (CPU) or an application processor (AP)) which performs corresponding operations by executing one or more software programs which are stored in a memory device.

The term "module" used herein may include a unit, which is implemented with hardware, software, or firmware, and may be interchangeably used with the terms "logic", "logical block", "part", "circuit", or the like. The "module" may be a minimum unit of an integrated part or a part thereof or may be a minimum unit for performing one or more functions or a part thereof. The "module" may be implemented mechanically or electronically and may include, for example, an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media in the form of a program module. The instruction, when executed by a processor, may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The one or more instructions may contain a code made by a compiler or a code executable by an interpreter.

Each component (e.g., a module or a program module) according to various embodiments may be composed of single entity or a plurality of entities, a part of the above-described sub-components may be omitted, or other sub-components may be further included. Alternatively or additionally, after being integrated in one entity, some components (e.g., a module or a program module) may identically or similarly perform the function executed by each corresponding component before integration. According to various embodiments, operations executed by modules, program modules, or other components may be executed by a successive method, a parallel method, a repeated method, or a heuristic method, or at least one part of operations may be executed in different sequences or omitted. Alternatively, other operations may be added.

The invention claimed is:

1. An electronic device comprising:
   a housing; and
   a patterned region formed on at least part of a surface of the housing,
   wherein the patterned region includes a first edge, a second edge, and a first pattern formed between the first edge and the second edge,
   wherein the first pattern includes a first ridge, a first valley and a second valley located closer to an interior space of the housing than the first ridge, and first inclined surfaces extending from the first ridge to the first valley and the second valley,
   wherein the first ridge is formed in a first color, and
   wherein the first inclined surfaces are formed in a second color.

2. The electronic device of claim 1, wherein the first pattern is formed such that the first valley and the second valley are spaced apart from each other by a first pitch, and
   wherein the first pitch ranges from 0.10 mm to 0.60 mm.

3. The electronic device of claim 1, wherein the patterned region further includes a second pattern formed between the first edge and the second edge and adjacent to the first pattern in one direction,
   wherein the second pattern includes a second ridge, a third valley and a fourth valley located closer to the interior space of the housing than the second ridge, and second inclined surfaces extending from the second ridge to the third valley and the fourth valley,
   wherein the first pattern is formed such that the first valley and the second valley are spaced apart from each other by a first pitch, and
   wherein the second pattern is formed such that the third valley and the fourth valley are spaced apart from each other by a second pitch different from the first pitch.

4. The electronic device of claim 3, wherein the second valley and the third valley include an edge that the first inclined surface and the second inclined surface substantially cross each other to form.

5. The electronic device of claim 4, wherein the first inclined surface and the second inclined surface form a predetermined angle with the edge as the center, and
   wherein the predetermined angle ranges from 60 degrees to 100 degrees.

6. The electronic device of claim 3, wherein the patterned region further includes a third pattern formed between the first edge and the second edge and adjacent to the second pattern in the one direction,
   wherein the third pattern includes a third ridge, a fifth valley and a sixth valley located closer to the interior space of the housing than the third ridge, and third inclined surfaces extending from the third ridge to the fifth valley and the sixth valley, and
   wherein the third pattern is formed such that the fifth valley and the sixth valley are spaced apart from each other by a third pitch.

7. The electronic device of claim 6, wherein the first pitch and the third pitch are the same as each other, and
   wherein the second pitch is smaller or greater than the first pitch and the third pitch.

8. The electronic device of claim 6, wherein the first pitch is greater than the second pitch and the third pitch, and
   wherein the second pitch is greater than the third pitch.

9. The electronic device of claim 6, wherein the first pitch ranges from 0.10 mm to 0.60 mm,
   wherein the second pitch ranges from 0.10 mm to 0.40 mm, and
   wherein the third pitch ranges from 0.10 mm to 0.30 mm.

10. The electronic device of claim 1, wherein the first color and the second color are complementary colors.

11. An electronic device comprising:
    a housing including a first surface, a second surface configured to face away from the first surface, and a third surface configured to surround a space between the first surface and the second surface; and
    a display disposed in the space of the housing so as to be visible through the first surface,
    wherein the third surface includes a first region including a pattern formed on a surface thereof, a second region formed between the first region and the first surface, and a third region formed between the first region and the second surface, and
    wherein the first region includes a curved surface having the center of curvature located in a direction toward the space of the housing with respect to the third surface.

12. The electronic device of claim 11, wherein the third surface includes a first metal region and a second metal region formed of a metallic material and an insulating region formed of an insulating material and formed between the first metal region and the second metal region to insulate the first metal region and the second metal region, and
    wherein the pattern is continuously formed from the first region included in the first metal region or the second metal region to the first region included in the insulating region.

13. The electronic device of claim 11, wherein at least part of the second region and/or the third region is formed to be a flat surface.

14. The electronic device of claim 11, wherein at least part of the second region and/or the third region is formed to be a curved surface having a different curvature from the first region.

15. The electronic device of claim 11, wherein the pattern includes a first valley spaced apart from the center of curvature by a first distance, a second valley adjacent to the first valley and spaced apart from the center of curvature by the first distance, and a ridge formed between the first valley and the second valley and spaced apart from the center of curvature by a second distance greater than the first distance,
    wherein a first inclined surface is formed between the first valley and the ridge, the first inclined surface being a substantially flat surface, and
    wherein a second inclined surface is formed between the second valley and the ridge, the second inclined surface being a substantially flat surface.

* * * * *